(12) United States Patent
El-Zein et al.

(10) Patent No.: US 6,590,236 B1
(45) Date of Patent: Jul. 8, 2003

(54) SEMICONDUCTOR STRUCTURE FOR USE WITH HIGH-FREQUENCY SIGNALS

(75) Inventors: Nada El-Zein, Phoenix, AZ (US); Jamal Ramdani, Gilbert, AZ (US); Kurt Eisenbeiser, Tempe, AZ (US); Ravindranath Droopad, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/624,296

(22) Filed: Jul. 24, 2000

(51) Int. Cl.$^7$ .......................................... H01L 31/0328
(52) U.S. Cl. ............................. 257/201; 257/2; 257/78; 257/609; 257/615; 257/616; 438/900; 438/933; 438/752
(58) Field of Search .............................. 257/2, 78, 200, 257/201, 275, 607, 609, 613, 615, 616, 916, 917; 438/190, 407, 520, 528, 548, 752, 900, 918, 933

(56) References Cited

U.S. PATENT DOCUMENTS

| | | | |
|---|---|---|---|
| 3,670,213 A | 6/1972 | Nakagawa et al. | 257/449 |
| 4,242,595 A | 12/1980 | Lehovec | 326/132 |
| 4,289,920 A | 9/1981 | Hovel | 136/246 |

(List continued on next page.)

FOREIGN PATENT DOCUMENTS

| | | |
|---|---|---|
| DE | 197 12 496 | 10/1997 |
| EP | 0 581 239 | 2/1994 |
| EP | 0 810 666 | 12/1997 |
| EP | 0 875 922 | 11/1998 |
| EP | 0 926 739 | 6/1999 |
| EP | 0 957 522 | 11/1999 |
| EP | 0 965 453 | 12/1999 |
| EP | 1 043 426 | 10/2000 |
| EP | 1 109 212 | 6/2001 |
| JP | 60-210018 | 10/1985 |

(List continued on next page.)

OTHER PUBLICATIONS

Patent Abstracts of Japan; vol. 012, No. 481; Dec. 15, 1988 & JP 63 198365; Aug. 17, 1988.

A. Fathimulla et al; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170, XP000341253 IEEE, New York, NY, USA.

"Optimizing GMR Spin Valves: The Outlook for Improved Properties", W. F. Englhoff et al., 1998 Int'l NonVolatile Memory Technology Conference, pp. 34–37.

(List continued on next page.)

Primary Examiner—Nathan J. Flynn
Assistant Examiner—Scott R. Wilson
(74) Attorney, Agent, or Firm—Oblon, Spivak, McClelland, Maier & Neustadt, P.C.

(57) ABSTRACT

High quality epitaxial layers of compound semiconductor materials can be grown overlying large silicon wafers by first growing an accommodating buffer layer on a silicon wafer. The accommodating buffer layer is a layer of monocrystalline oxide spaced apart from the silicon wafer by an amorphous interface layer of silicon oxide. The amorphous interface layer dissipates strain and permits the growth of a high quality monocrystalline oxide accommodating buffer layer. Any lattice mismatch between the accommodating buffer layer and the underlying silicon substrate is taken care of by the amorphous interface layer. These semiconductor materials have applications involving communications with high frequency signals including intelligent transportation systems such as automobile radar systems, smart cruise control systems, collision avoidance systems, and automotive navigation systems; and electronic payment systems that use microwave or RF signals such as electronic toll payment for various transportation systems including train fares, and toll roads, parking structures, and toll bridges for automobiles.

59 Claims, 8 Drawing Sheets

U.S. PATENT DOCUMENTS

| | | |
|---|---|---|
| 4,398,342 A | 8/1983 | Pitt et al. .................... 438/3 |
| 4,424,589 A | 1/1984 | Thomas et al. ............ 382/317 |
| 4,439,014 A | 3/1984 | Stacy et al. ................ 359/247 |
| 4,442,590 A | 4/1984 | Stockton et al. ............. 438/81 |
| 4,459,325 A | 7/1984 | Nozawa et al. ............ 438/400 |
| 4,482,422 A | 11/1984 | McGinn et al. .............. 117/95 |
| 4,667,088 A | 5/1987 | Kramer et al. .............. 235/380 |
| 4,748,485 A | 5/1988 | Vasudev .................... 257/353 |
| 4,756,007 A | 7/1988 | Qureshi et al. ............. 375/259 |
| 4,772,929 A | 9/1988 | Manchester ................ 257/422 |
| 4,773,063 A | 9/1988 | Hunsperger et al. ........ 359/130 |
| 4,841,775 A | 6/1989 | Ikeda et al. .................. 73/704 |
| 4,845,044 A | 7/1989 | Ariyoshi et al. ............ 438/480 |
| 4,882,300 A | 11/1989 | Inoue et al. ................ 437/236 |
| 4,885,376 A | 12/1989 | Akasaki et al. .............. 556/18 |
| 4,888,202 A | 12/1989 | Murakami et al. .......... 117/105 |
| 4,889,402 A | 12/1989 | Reinhart ....................... 385/2 |
| 4,891,091 A | 12/1989 | Wanlass et al. .............. 117/90 |
| 4,901,133 A | 2/1990 | Curran et al. ............... 257/637 |
| 4,965,649 A | 10/1990 | Zanio et al. ................ 257/442 |
| 4,984,043 A | 1/1991 | Vinal ......................... 257/365 |
| 4,999,842 A | 3/1991 | Huang et al. ................ 372/45 |
| 5,051,790 A | 9/1991 | Hammer ...................... 257/80 |
| 5,055,445 A | 10/1991 | Belt et al. ................... 505/452 |
| 5,073,981 A | 12/1991 | Giles et al. ................. 359/174 |
| 5,081,519 A | 1/1992 | Nishimura .................. 257/200 |
| 5,132,648 A | 7/1992 | Trinh et al. ................. 333/128 |
| 5,140,651 A | 8/1992 | Soref et al. .................... 385/2 |
| 5,143,854 A | 9/1992 | Pirrung et al. .............. 436/518 |
| 5,155,658 A | 10/1992 | Inam et al. ................. 361/321 |
| 5,185,589 A | 2/1993 | Krishnaswamy et al. ... 333/133 |
| 5,191,625 A | 3/1993 | Gustavsson .................. 385/14 |
| 5,194,397 A | 3/1993 | Cook et al. ................. 438/684 |
| 5,208,182 A | 5/1993 | Narayan et al. ............ 438/507 |
| 5,216,729 A | 6/1993 | Berger et al. ................. 385/31 |
| 5,227,196 A | 7/1993 | Itoh ......................... 427/249.1 |
| 5,248,564 A | 9/1993 | Ramesh ..................... 428/688 |
| 5,270,298 A | 12/1993 | Ramesh ........................ 505/1 |
| 5,281,834 A | 1/1994 | Cambou et al. ............ 257/200 |
| 5,306,649 A | 4/1994 | Hebert ....................... 438/345 |
| 5,310,707 A | 5/1994 | Oishi et al. ................. 501/126 |
| 5,314,547 A | 5/1994 | Heremans et al. .......... 148/33.1 |
| 5,326,721 A | 7/1994 | Summerfelt ................ 437/131 |
| 5,352,926 A | 10/1994 | Andrews .................... 257/717 |
| 5,356,509 A * | 10/1994 | Terranova et al. ............ 117/58 |
| 5,371,734 A | 12/1994 | Fischer ...................... 370/311 |
| 5,372,992 A | 12/1994 | Itozaki et al. .............. 505/238 |
| 5,394,489 A | 2/1995 | Koch .......................... 385/14 |
| 5,405,802 A | 4/1995 | Yamagata et al. .......... 438/459 |
| 5,406,202 A | 4/1995 | Mehrgardt et al. .......... 324/251 |
| 5,418,389 A | 5/1995 | Watanabe ................... 257/295 |
| 5,441,577 A | 8/1995 | Sasaki et al. ............... 136/244 |
| 5,442,561 A | 8/1995 | Yoshizawa et al. ......... 700/100 |
| 5,453,727 A | 9/1995 | Shibasaki et al. ......... 338/32 R |
| 5,466,631 A | 11/1995 | Ichikawa et al. ........... 438/406 |
| 5,473,047 A | 12/1995 | Shi ........................... 528/310 |
| 5,473,171 A | 12/1995 | Summerfelt ................ 257/183 |
| 5,479,033 A | 12/1995 | Baca et al. ................. 257/192 |
| 5,486,406 A | 1/1996 | Shi ........................... 428/207 |
| 5,491,461 A | 2/1996 | Partin et al. .............. 338/32 R |
| 5,492,859 A | 2/1996 | Sakaguchi et al. .......... 438/459 |
| 5,494,711 A | 2/1996 | Takeda et al. .............. 427/473 |
| 5,504,035 A | 4/1996 | Rostoker et al. ........ 228/180.22 |
| 5,504,183 A | 4/1996 | Shi et al. ................... 528/272 |
| 5,511,238 A | 4/1996 | Bayraktaroglu .............. 455/81 |
| 5,514,904 A | 5/1996 | Onga et al. ................ 257/627 |
| 5,515,047 A | 5/1996 | Yamakido et al. .......... 341/153 |
| 5,515,810 A | 5/1996 | Yamashita ................... 117/17 |
| 5,519,235 A | 5/1996 | Ramesh ..................... 257/295 |
| 5,528,057 A | 6/1996 | Yanagase et al. ............. 257/96 |
| 5,528,067 A | 6/1996 | Farb .......................... 257/401 |
| 5,549,977 A * | 8/1996 | Jin et al. .................... 428/692 |
| 5,551,238 A | 9/1996 | Bayraktaroghu ............. 60/643 |
| 5,552,547 A | 9/1996 | Shi ............................... 546/7 |
| 5,572,052 A | 11/1996 | Kashihara et al. .......... 257/295 |
| 5,589,284 A | 12/1996 | Summerfelt et al. ........ 428/697 |
| 5,596,205 A | 1/1997 | Reedy et al. ................... 257/9 |
| 5,602,418 A | 2/1997 | Imai et al. .................. 257/627 |
| 5,610,744 A | 3/1997 | Ho et al. .................... 359/118 |
| 5,633,724 A | 5/1997 | King et al. ................. 356/445 |
| 5,650,646 A | 7/1997 | Summerfelt ................ 257/295 |
| 5,656,382 A | 8/1997 | Nashimoto .................. 428/620 |
| 5,659,180 A | 8/1997 | Shen et al. ................... 257/25 |
| 5,661,112 A | 8/1997 | Ha et al. .................... 505/232 |
| 5,674,366 A | 10/1997 | Hayashi et al. ........ 204/298.09 |
| 5,679,965 A | 10/1997 | Schetzina .................. 257/103 |
| 5,731,220 A | 3/1998 | Tsu et al. ..................... 437/60 |
| 5,745,631 A | 4/1998 | Reinker ..................... 385/132 |
| 5,746,543 A | 5/1998 | Ooms et al. ................ 405/186 |
| 5,754,319 A | 5/1998 | Van De Voorde et al. .. 359/109 |
| 5,776,621 A | 7/1998 | Nashimoto .................. 428/688 |
| 5,777,350 A | 7/1998 | Nakamura et al. ............ 257/96 |
| 5,789,845 A | 8/1998 | Wadaka et al. ............. 310/334 |
| 5,792,569 A | 8/1998 | Sun et al. ................... 428/692 |
| 5,792,679 A | 8/1998 | Nakato ....................... 438/162 |
| 5,796,648 A | 8/1998 | Koivakubo et al. ......... 365/145 |
| 5,801,072 A | 9/1998 | Barber ....................... 438/107 |
| 5,801,105 A * | 9/1998 | Yano et al. ................. 438/785 |
| 5,825,055 A | 10/1998 | Summerfelt ................ 257/183 |
| 5,827,755 A | 10/1998 | Yonchara et al. ............. 438/30 |
| 5,828,080 A * | 10/1998 | Yano et al. ................... 257/43 |
| 5,833,603 A | 11/1998 | Kovacs et al. .............. 600/317 |
| 5,838,035 A | 11/1998 | Ramesh ..................... 257/295 |
| 5,846,846 A | 12/1998 | Suh et al. ...................... 438/2 |
| 5,863,326 A | 1/1999 | Nause et al. ................ 117/217 |
| 5,872,493 A | 2/1999 | Ella ........................... 333/191 |
| 5,874,860 A | 2/1999 | Brunel et al. ............... 330/285 |
| 5,880,452 A | 3/1999 | Plesko .................... 235/472.01 |
| 5,883,564 A | 3/1999 | Partin ....................... 338/32 R |
| 5,907,792 A | 5/1999 | Droopad et al. ............ 438/791 |
| 5,912,068 A | 6/1999 | Jia ............................. 428/210 |
| 5,937,274 A | 8/1999 | Kondow et al. .............. 438/47 |
| 5,948,161 A | 9/1999 | Kizuki ......................... 117/89 |
| 5,959,879 A | 9/1999 | Koo .......................... 365/145 |
| 5,962,069 A | 10/1999 | Schindler et al. ........... 427/226 |
| 5,963,291 A | 10/1999 | Wu et al. .................... 349/196 |
| 5,987,011 A | 11/1999 | Toh ........................... 370/331 |
| 6,002,375 A | 12/1999 | Corman et al. ............. 343/853 |
| 6,011,641 A | 1/2000 | Shin et al. .................. 359/257 |
| 6,011,646 A | 1/2000 | Mirkarimi et al. .......... 359/359 |
| 6,022,140 A | 2/2000 | Fraden et al. ............... 374/158 |
| 6,023,082 A | 2/2000 | McKee et al. .............. 257/295 |
| 6,028,853 A | 2/2000 | Haartsen .................... 370/338 |
| 6,049,702 A * | 4/2000 | Tham et al. ................... 455/78 |
| 6,055,179 A | 4/2000 | Koganei et al. ............. 365/158 |
| 6,078,717 A | 6/2000 | Nashimoto et al. ......... 385/130 |
| 6,088,216 A | 7/2000 | Laibowitz et al. ........ 361/321.4 |
| 6,090,659 A | 7/2000 | Laibowitz et al. .......... 438/240 |
| 6,107,721 A | 8/2000 | Lakin ........................ 310/321 |
| 6,108,125 A | 8/2000 | Yano .......................... 359/344 |
| 6,150,239 A | 11/2000 | Goesele et al. ............. 438/458 |
| 6,153,010 A | 11/2000 | Kiyoku et al. ................ 117/95 |
| 6,175,497 B1 | 1/2001 | Tseng et al. ................ 361/704 |
| 6,175,555 B1 | 1/2001 | Hoole ........................ 370/280 |
| 6,184,044 B1 | 2/2001 | Sone et al. .................... 438/3 |
| 6,191,011 B1 | 2/2001 | Gilboa et al. ............... 438/488 |
| 6,197,503 B1 | 3/2001 | Vo-Dinh et al. ................ 435/6 |
| 6,204,737 B1 | 3/2001 | Ella ........................... 333/187 |
| 6,211,096 B1 | 4/2001 | Allman et al. .............. 438/787 |
| 6,224,669 B1 | 5/2001 | Yi et al. ..................... 117/108 |
| 6,229,159 B1 | 5/2001 | Suzuki ......................... 257/84 |

| | | | |
|---|---|---|---|
| 6,239,449 B1 | 5/2001 | Fafard et al. | 257/17 |
| 6,241,821 B1 | 6/2001 | Yu et al. | 117/108 |
| 6,242,686 B1 | 6/2001 | Kishimoto et al. | 136/255 |
| 6,248,459 B1 | 6/2001 | Wang et al. | 428/700 |
| 6,252,261 B1 | 6/2001 | Usui et al. | 257/190 |
| 6,255,198 B1 | 7/2001 | Linthicum et al. | 438/481 |
| 6,265,749 B1 | 7/2001 | Gardner et al. | 257/410 |
| 6,268,269 B1 | 7/2001 | Lee et al. | 438/473 |
| 6,291,319 B1 | 9/2001 | Yu et al. | 438/481 |
| 6,313,486 B1 | 11/2001 | Kencke et al. | 257/192 |
| 6,316,785 B1 | 11/2001 | Nunoue et al. | 257/14 |
| 6,343,171 B1 | 1/2002 | Yoshimura et al. | 385/50 |
| 2001/0013313 A1 | 8/2001 | Droopad et al. | 117/200 |
| 2002/0008234 A1 | 1/2002 | Emrick | 257/43 |

FOREIGN PATENT DOCUMENTS

| | | | |
|---|---|---|---|
| JP | 60-212018 | 10/1985 | |
| JP | 60212018 A | 10/1985 | H03H/9/25 |
| JP | 63-198365 | 8/1988 | |
| JP | 1052329 A | 2/1989 | H01B/12/06 |
| JP | 64-50575 | 2/1989 | |
| JP | 64-52329 | 2/1989 | |
| JP | 1-102435 | 4/1989 | |
| JP | 0812494 | 1/1996 | |
| JP | 10-256154 | 9/1998 | |
| JP | 10-303396 | 11/1998 | |
| JP | 11-340542 | 10/1999 | |
| JP | 2 000 1645 | 6/2000 | |
| WO | WO 92/10875 | 6/1992 | |
| WO | WO 94/03908 | 2/1994 | |
| WO | WO 98/05807 | 1/1998 | |
| WO | WO 01/33585 | 5/2001 | |
| WO | WO 01/37330 | 5/2001 | |
| WO | WO 02/01648 | 1/2002 | |

OTHER PUBLICATIONS

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acousto–optic applications", M. Rotter et al., 1997 American Institute of Physics, pp. 2097–2099.

"Surface Acoustic Wave Propagation in PZT/YBCO/SrTiO$_3$ and PbTi O$_3$/YBCO/SrTiO$_3$ Epitaxial Heterostructures", Dept. of Physics & Astrophysics, Univ. of Delhi, pp. 275–283.

"Ferroelectric Field Effect Transisitor Based on Epitaxial Perovskite Heterostructures", S. Mathews et al., American Association for the Advancement of Science, 1997, pp. 238–240.

"Formation of Si Epi./MgO–Al$_2$O$_3$ Epi./SiO$_3$/Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction and Regrowth Control of CeO$_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of CeO$_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented (Pb,La)(Zr,Ti)O$_3$ Thin Films on Amorphous Substrates"; IEEE, 1992; pp. 301–304.

Timothy E. Glassman et al.; "Evidence for Cooperative Oxidation of MoCVD Precursors Used in Ba$_x$Sr$_{1-x}$TiO$_3$ Film Growth"; Mat. Res. Soc. Symp. Proc. vol. 446, 1997 Materials Research Society; pp. 321–326.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8, No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in La$_{0.67}$Ca$_{0.33}$MnO$_{3-\delta}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of materials combination for system–on–a chip preparation"; 1999 IEEE International SOI Conference, Oct. 1999; pp. 104–105.

T. Kannianinen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Formation and Characterization of Eptiaxial TiO$_2$ and BaTiO$_3$/TiO$_2$ Films on Si Substrate"; Japan Journal Applied Physics Letters; vol. 34; 1995; pp. 808–811.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27; No. 26; pp. 3592–3594.

H. Takahashi et al.; "Arrayed–Waveguide Grating for Wavelength Division Multi/Demultiplexer with Nanometre Resolution"; Electronics Letters; Jan. 18, 1990; vol. 26, No. 2; pp. 87–88.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

K. Eisenbeiser; "Field Effect Transistors with $SrTiO_3$ Gate Dielectric on Si"; Applied Physics Letters; vol. 76, No. 10; Mar. 6, 2000; pp. 1324–1326.

Stephen A. Mass; "Microwave Mixers"; Second Edition; 2 pp.

Douglas J. Hamilton et al.; "Basic Integrated Circuit Engineering"; p. 2; 1975.

Takeshi Obata: "Tunneling Magnetoresistance at Up to 270 K in $La_{0.8}Sr_{0.2}MnO_3/SrTiO_3/La_{0.8}Sr_{0.2}MnO_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using $YbaCuO/CeO_2$ Heterostructures"; Physica C; vol. 282–287, No. 2003; Aug. 1, 1997; pp. 1231–1232.

Shogo Imada et al; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of $ZnO/SiO_2/Si$ Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

John W. Goodman et al; "Optical Interconnections For VLSI Systems", Proceedings of the IEEE, vol. 72, No. 7 Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York, NY, USA; ISBN: 0–7803–0522–1.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

S.N. Subbarao et al.; "Monolithic PIN Photodetector and FET Amplifier on GaAs–os–Si"; IEEE; GaAs IC Symposium–163–166; 1989.

Don W. Shaw; "Epitaxial GaAs on Si: Progress and Potential Applications"; Mat. Res. Soc. Symp. Proc.; pp. 15–30; 1987.

T.A. Landgo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

X. W. Li et al; "Epitaxial La0.67Sr0.33MnO3 Magnetic Tunnel Junctions"; J. Appl. Phys. 81(8), Apr. 15, 1997.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Wu et al., "Highly Oriented (Pb, La) (Zr, Ti)O3 Thin Films On Amorphous Substrates", IEEE, 1992, pp. 301–304.

Fathimulla et al., "Monolithic Integration of InGa/As/InAIAs MODFETs And RTDs On InP–Bonded–To Si Substrate", Fourth International Conf. on Indium Phosphide and Related Materials, Newport, RI Apr. 21–24, 1992, pp. 167–170.

Zhu et al., "Molecular Beam Epitaxy Of GaAs On Si–On–Insulator", Applied Physics Letters 59(1991) Jul. 8 No. 2, pp. 210–212.

Goodman et al., "Optical Interconnections For VLSI Systems", Proceedings of the IEEE, vol. 72, No. 7 Jul. 1984.

* cited by examiner

SEMICONDUCTOR STRUCTURE FOR USE WITH HIGH-FREQUENCY SIGNALS

FIELD OF THE INVENTION

This invention relates generally to semiconductor structures and devices and to a method for their fabrication, and more specifically to compound semiconductor structures and devices and to the fabrication and use of semiconductor structures, devices, and integrated circuits that include a monocrystalline compound semiconductor material. More specifically, this invention relates to semiconductor structures for use with microwave and radio-frequency (RF) signals, and to a method for their fabrication.

BACKGROUND OF THE INVENTION

The vast majority of semiconductor discrete devices and integrated circuits are fabricated from silicon, at least in part because of the availability of inexpensive, high quality monocrystalline silicon substrates. Other semiconductor materials, such as the so called compound semiconductor materials, have physical attributes, including wider bandgap and/or higher mobility than silicon, or direct bandgaps that makes these materials advantageous for certain types of semiconductor devices. Unfortunately, compound semiconductor materials are generally much more expensive than silicon and are not available in large wafers as is silicon. Gallium arsenide (GaAs), the most readily available compound semiconductor material, is available in wafers only up to about 150 millimeters (mm) in diameter. In contrast, silicon wafers are available up to about 300 mm and are widely available at 200 mm. The 150 mm GaAs wafers are many times more expensive than are their silicon counterparts. Wafers of other compound semiconductor materials are even less available and are more expensive than GaAs.

Because of the desirable characteristics of compound semiconductor materials, and because of their present generally high cost and low availability in bulk form, for many years attempts have been made to grow thin films of the compound semiconductor materials on a foreign substrate. To achieve optimal characteristics of the compound semiconductor material, however, a monocrystalline film of high crystalline quality is desired. Attempts have been made, for example, to grow layers of a monocrystalline compound semiconductor material on germanium, silicon, and various insulators. These attempts have generally been unsuccessful because lattice mismatches between the host crystal and the grown crystal have caused the resulting thin film of compound semiconductor material to be of low crystalline quality.

If a large area thin film of high quality monocrystalline compound semiconductor material was available at low cost, a variety of semiconductor devices could advantageously be fabricated in that film at a low cost compared to the cost of fabricating such devices on a bulk wafer of compound semiconductor material or in an epitaxial film of such material on a bulk wafer of compound semiconductor material. In addition, if a thin film of high quality monocrystalline compound semiconductor material could be realized on a bulk wafer such as a silicon wafer, an integrated device structure could be achieved that took advantage of the best properties of both the silicon and the compound semiconductor material.

One application for such a compound semiconductor is in devices that use microwave or radio frequency (RF) signals. Such devices include, for example, intelligent transportation systems such as automobile radar systems, smart cruise control systems, collision avoidance systems, crash protection systems and automotive navigation systems. They also include electronic payment systems that use microwave or RF signals such as electronic toll payment for various transportation systems including train fares, toll roads, parking structures, and toll bridges.

Largely in an effort to reduce high cost to society of automobile accidents caused by driver error, collision avoidance systems have been proposed that typically use radar installed on automobiles to detect objects in the path of the automobile and warn the operator, apply the vehicle brakes, or take other evasive action when necessary to avoid a collision. In addition to monitoring objects directly in an automobile's path, collision avoidance systems can preferably monitor other vehicles in adjacent lanes in case those other vehicles wonder into the automobile's lane. They may also be used to detect objects on the side of the automobile; for instance, to warn a driver not to change lanes when another vehicle is in his blind spot. Collision avoidance systems have also been proposed to detect objects behind the automobile; for instance, for use when backing up to warn a driver that he is about to hit another vehicle or run over a small child.

Crash protection systems have also been proposed which would detect an imminent collision and take appropriate action. This action may include deploying air bags prior to a collision actually occurring. Such a crash protection system would allow more time for air bags to deploy, thus reducing the required force associated with their deployment. This could reduce the potential for injury resulting from air bag deployment, particularly to small children. It has been proposed that crash protection systems may also increase the effectiveness of air bags in particular types of collisions, such as side air bags deployed in side impact collisions. Pre-impact deployment would be a particular advantage is such applications where the distance between an occupant and the structure of the automobile is already marginally sufficient for deployment of an air bag.

Inventors have further proposed that such radar systems could tie into the automobile's cruise control system, and automatically slow the speed of the automobile when traffic conditions warrant, rather than relying the driver to perform this function. Such systems are called intelligent cruise control systems, and in addition to improving safety, also relieve some of the stress associated with operating an automobile in traffic. Rather than being limited to maintaining a constant speed, when traffic prevented traveling at the desired maximum speed, intelligent cruise control systems would automatically adjust the speed of the automobile to maintain a safe distance between it and the vehicle in front of it. If manipulation of the throttle was not sufficient, the system would preferably automatically apply the automobile's brakes. If widely used, intelligent cruise control systems may also have other advantages. For instance, such systems could be programmed to maintain more constant speeds in traffic situations. This could reduce fuel consumption and vehicle wear. Also, if reaction times are quicker and more reliable than those of human drivers, then distances between automobiles could be reduced, thus increasing the carrying capacity of roadways and increasing the average speed of traffic.

Collision avoidance systems and intelligent cruise control systems require, inter alia, some kind of a detector mounted at the front of the automobile called a forward-looking sensor. Forward-looking sensors are typically radar systems such as continuous-wave radar, two-frequency continuous-wave radar, or frequency-modulated continuous-wave radar. As the name implies, continuous-wave radar continuously transmits a signal at a single frequency. The transmitted energy is reflected by objects in its path and received by a radar receiver. The frequency of the received signal is slightly changed (Doppler shifted) by the movement of the object relative to the automobile. By detecting the change in frequency, the system is able to determine the speed of the object relative to the automobile. However, a single frequency continuous wave radar system is not able to determine how far away the object is from the automobile. A two-frequency radar system transmits a signal at two frequencies and looks at the phase difference between the two returning signals as well as the Doppler shift. From this, the distance to the object, as well as the relative speed, can be calculated. Frequency-modulated continuous-wave radar continuously changes the frequency of the signal, back and forth over a range of frequencies. By looking at the frequency received from an object, the system can determine when the signal was transmitted; and hence, how far away the object is. Forward-looking sensors may also be multi-beam radar systems. Other types of radar are also well know to a person of ordinary skill in the art of radar systems.

Automobile navigation systems have been proposed that transmit navigation information to automobiles traveling along a highway. The navigation information that is transmitted typically includes the position of the automobile, and the driver of the automobile is typically given instructions regarding what route to take, such as how to reach a destination he has entered into the system. The driver is preferably detoured around or warned about dangerous or congestive traffic conditions. Automobile navigation systems preferably also use a global positioning system (GPS) to determine the location of the automobile, and may be combined with collision avoidance systems, intelligent cruise control systems, and/or automatic toll collecting systems.

Electronic payment systems are in use, or have been proposed, that involve the identification of an automobile, smart card, or other object for the purpose of paying a fee. Some such systems do not require physical contact with the object, or even close proximity (such as a to read a magnetic strip), but rather, through the use of a radio frequency (RF) or microwave signal, only require a general proximity. Such systems associated with automobiles more commonly use RF signals, and include toll payment for toll roads or toll bridges, and parking fee payment for entering a parking garage. Such systems may alternatively use laser (bar code) readers or infra-red (IR). These systems generally include an interrogator (reader) located in the toll booth, and a transponder (tag) installed on the dashboard, windshield or other location on the automobile. The interrogator may, for example, send a signal that triggers the transponder, interrogate the transponder for specific information, and provide an acknowledgement message to the transponder. The tag typically identifies the automobile (via an identification code), providing sufficient information to bill, debit, or charge the owner for the amount of the toll. Tags may contain only read-only information, or may (smart tags) hold information as to the balance in the user's account. This communication can typically all take place while an automobile drives through the toll booth without stopping.

Such a system typically must have some kind of enforcement means for deterring passage through the toll booth by individuals who do not have transponders or are delinquent in their payment of tolls. Such enforcement means may include a gate that opens only when valid account information has been provided, or use of a surveillance camera that photographs offenders to collect evidence for bill collection or criminal enforcement.

Electronic toll collection eliminates the need for commuters to stop at toll booths, and eliminates the need for them to carry cash or other means of paying tolls. These consequences have various direct and indirect benefits including reducing commute times, reducing the need for personnel to man toll booths, reducing fuel consumption and air pollution caused by commuters stopping and waiting in line at toll booths, and reducing crime resulting from the temptation of commuters carrying cash to pay tolls. Similar systems have been proposed or are being used to pay tolls for riding mass transit systems such as trains, or for purchasing various commodities such as gasoline. Tags for such systems may be read-only, or may contain information such as regarding account balance (smart cards).

Today's systems for automobile radar or communication between an automobile and a fixed location typically use a hybrid of gallium arsenide (GaAs) or indium phosphide (InP) devices for sensing signals, and silicon (Si) based devices to do the signal processing and direct the appropriate signal to the appropriate circuitry. Most commonly, GaAs monolithic microwave integrated circuits (MMICs) are used for sensing, and a separate Si chip performs the signal processing. These MMICs contain both active elements such as diodes and transistors, and passive elements such as resistors, capacitors, and inductors, and have replaced earlier more-conventional "chip and wire" microwave and RF circuits. However, it would further simplify the structure and reduce the cost to be able to perform both functions (signal sensing, and signal processing) with one integrated circuit. In addition, as discussed above, compound semiconductors are very expensive, which has been a significant factor in preventing the above described systems, with their associated benefits to safety, reduction of energy consumption, collateral cost savings, and reduction of environmental pollution, from being widely applied. Accordingly, a need exists in applications that use high-frequency signals, for an inexpensive semiconductor structure that provides a high quality monocrystalline compound semiconductor film over another monocrystalline material and for a process for making such a structure.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
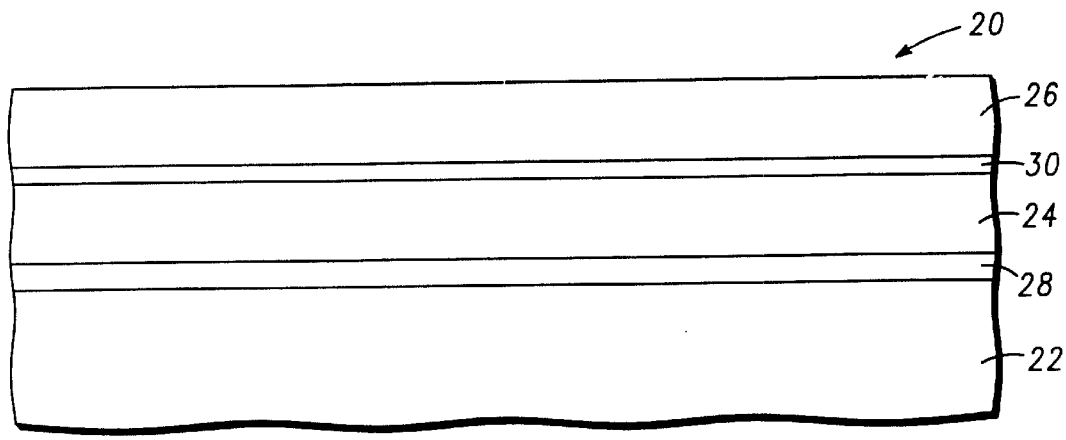
FIGS. 1–3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and compound semiconductor layer 26. As will be explained more fully below, the template layer helps to initiate the growth of the compound semiconductor layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with the underlying substrate and with the overlying compound semiconductor material. For example, the material could be an oxide or nitride having a lattice structure matched to the substrate and to the subsequently applied semiconductor material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites; lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:
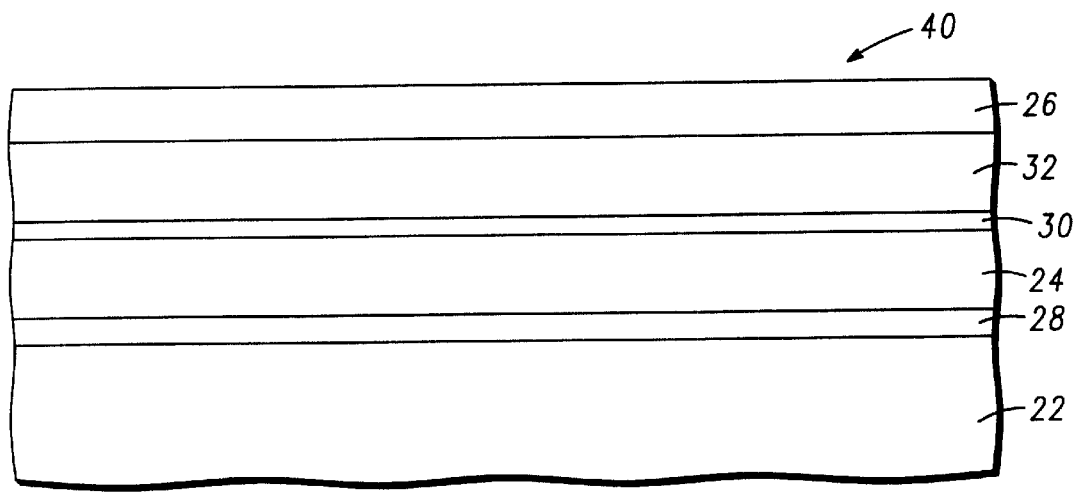

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and layer of monocrystalline compound semiconductor material 26. Specifically, the additional buffer layer is positioned between template layer 30 and the overlying layer of compound semiconductor material. The additional buffer layer, formed of a semiconductor or compound semiconductor material, serves to provide a lattice compensation when the lattice constant of the accommodating buffer layer cannot be adequately matched to the overlying monocrystalline compound semiconductor material layer.

Figure 3:
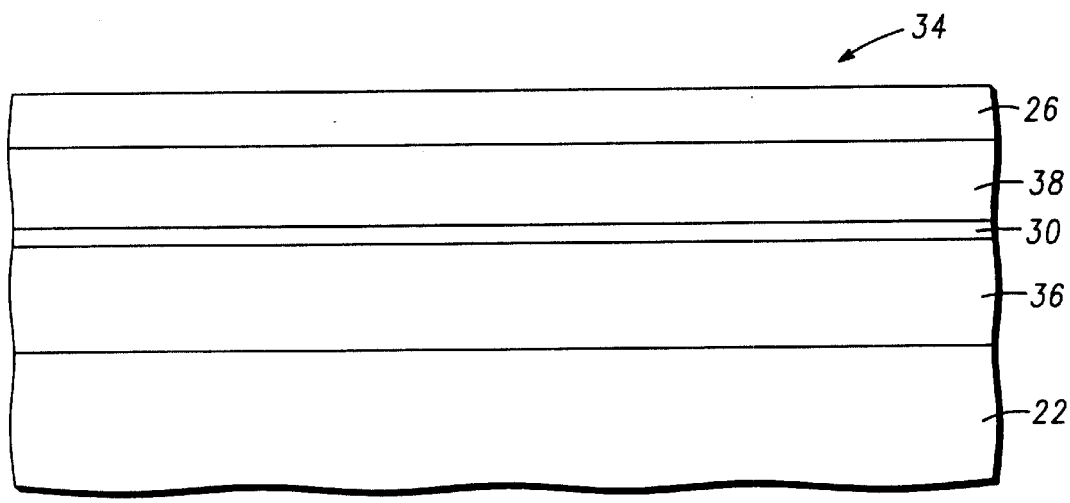

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional semiconductor layer 38.

As explained in greater detail below, amorphous layer 36 may be formed by first forming an accommodating buffer layer and an amorphous interface layer in a similar manner to that described above. Monocrystalline semiconductor layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and semiconductor layer 38 (subsequent to layer 38 formation) relieves stresses between layers 22 and 38 and provides a true compliant substrate for subsequent processing—e.g., compound semiconductor layer 26 formation.

The processes previously described above in connection with FIGS. 1 and 2 are adequate for growing monocrystalline compound semiconductor layers over a monocrystalline substrate. However, the process described in connection with FIG. 3, which includes transforming a monocrystalline accommodating buffer layer to an amorphous oxide layer, may be better for growing monocrystalline compound semiconductor layers because it allows any strain in layer 26 to relax.

Semiconductor layer 38 may include any of the materials described throughout this application in connection with either of compound semiconductor material layer 26 or additional buffer layer 32. For example, layer 38 may include monocrystalline Group IV or monocrystalline compound semiconductor materials.

In accordance with one embodiment of the present invention, semiconductor layer 38 serves as an anneal cap during layer 36 formation and as a template for subsequent semiconductor layer 26 formation. Accordingly, layer 38 is preferably thick enough to provide a suitable template for layer 26 growth (at least one monolayer) and thin enough to allow layer 38 to form as a substantially defect free monocrystalline semiconductor compound.

In accordance with another embodiment of the invention, semiconductor layer 38 comprises compound semiconductor material (e.g., a material discussed above in connection with compound semiconductor layer 26) that is thick enough to form devices within layer 38. In this case, a semiconductor structure in accordance with the present invention does not include compound semiconductor layer 26. In other words, the semiconductor structure in accordance with this embodiment only includes one compound semiconductor layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, compound semiconductor material layer 26 is a layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of compound semiconductor materials in the indium phosphide (InP) system. The compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 $\mu$m. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygenarsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSSe.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying compound semiconductor material. The compositions of other materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline compound semiconductor material layer. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between the accommodating buffer layer and the overlying monocrystalline compound semiconductor material layer. The buffer layer, a further monocrystalline semiconductor material, can be, for example, a graded layer of indium gallium arsenide (InGaAs) or indium aluminum arsenide (InAlAs). In accordance with one aspect of this embodiment, buffer layer 32 includes InGaAs, in which the indium composition varies from 0 to about 47%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline compound semiconductor material. Such a buffer layer is especially advantageous if there is a lattice mismatch between accommodating buffer layer 24 and monocrystalline compound semiconductor material layer 26.

EXAMPLE 6

This example provides exemplary materials useful in structure 34, as illustrated in FIG. 3. Substrate material 22, template layer 30, and monocrystalline compound semiconductor material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of semiconductor material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline compound semiconductor material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
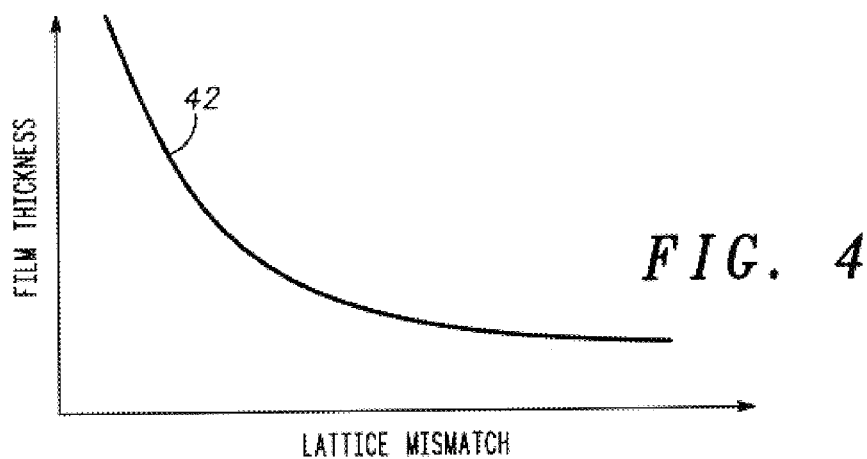
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that has a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2% monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. If the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown compound semiconductor layer can be used to reduce strain in the grown monocrystalline compound semiconductor layer that might result from small differences in lattice constants. Better crystalline quality in the grown monocrystalline compound semiconductor layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired compound semiconductor material. For the subsequent growth of a layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As bond. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
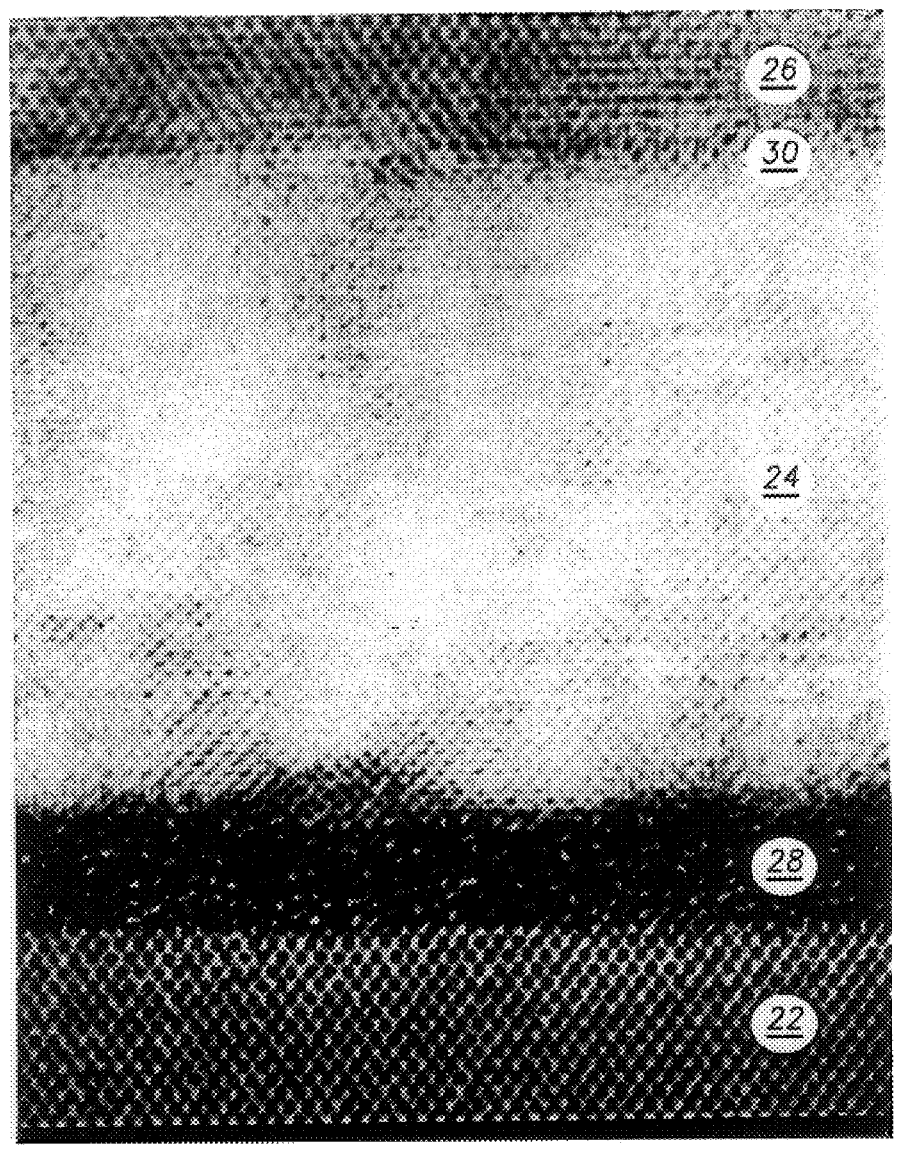
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with the present invention. Single crystal $SrTiO_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
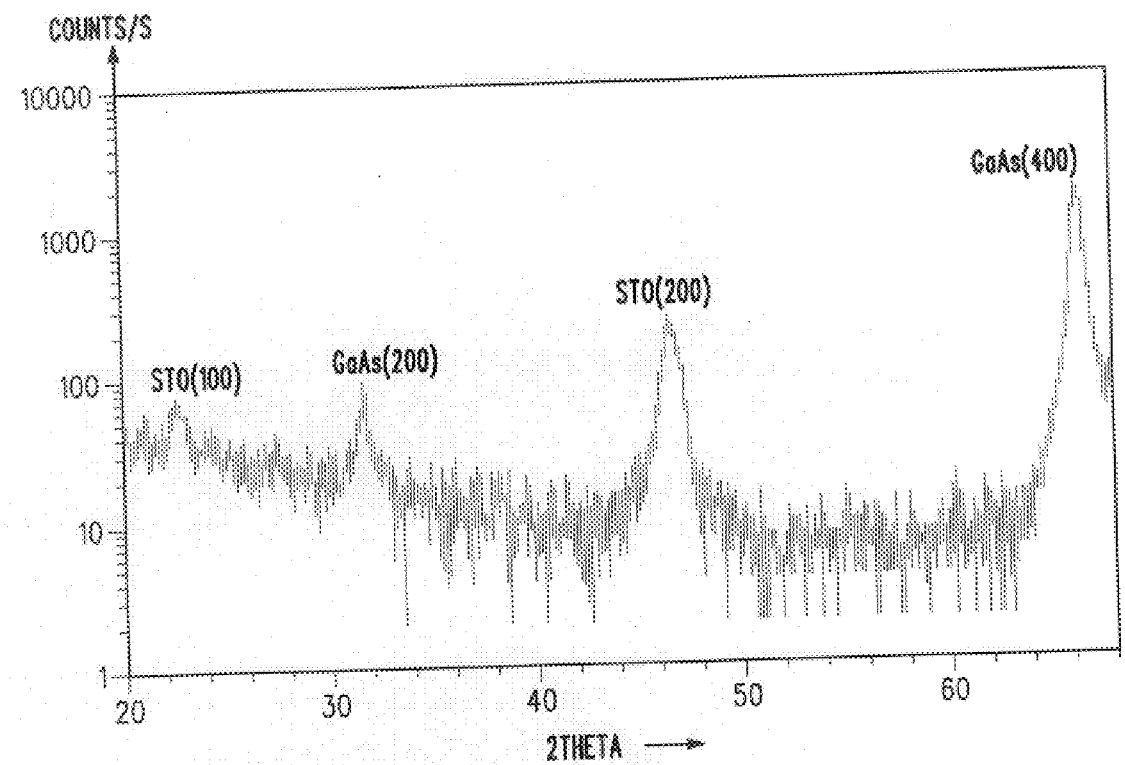
FIG. 6 illustrates an x-ray diffraction spectrum of a structure including a monocrystalline accommodating buffer layer.

FIG. 6 illustrates an x-ray diffraction spectrum taken on a structure including GaAs compound semiconductor layer 26 grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline compound semiconductor layer. If the buffer layer is a compound semiconductor superlattice, such a superlattice can be deposited, by MBE for example, on the template described above. If instead the buffer layer is a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and semiconductor layer 38 to a rapid thermal anneal process with a peak temperature of about 700° C. to about 1000° C. and a process time of about 10 seconds to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26 may be employed to deposit layer 38.

Figure 7:
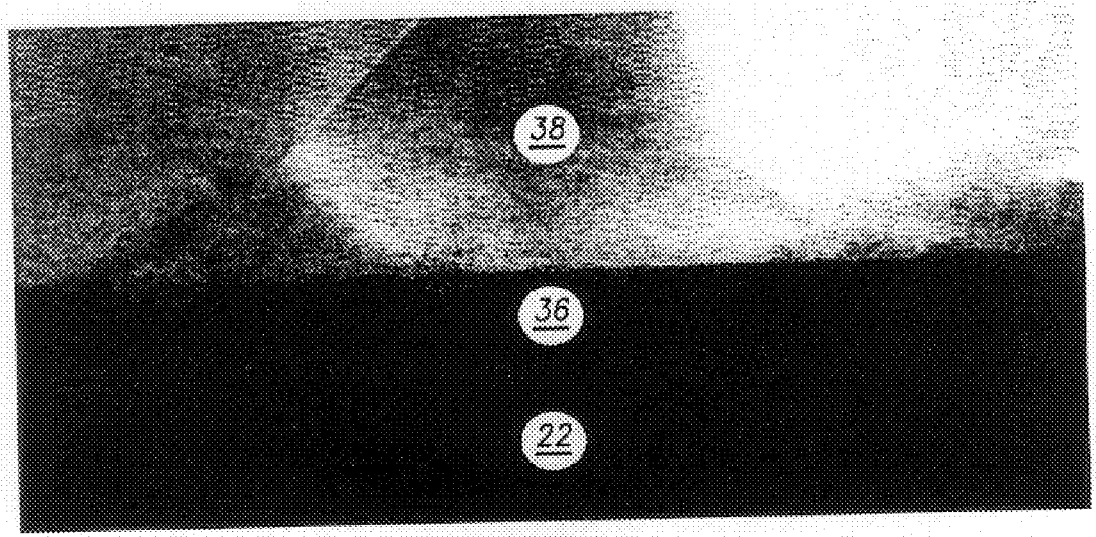
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, GaAs layer 38 is formed above the accommodating buffer layer and the accommodating buffer layer is exposed to an anneal process to form amorphous oxide layer 36.

Figure 8:
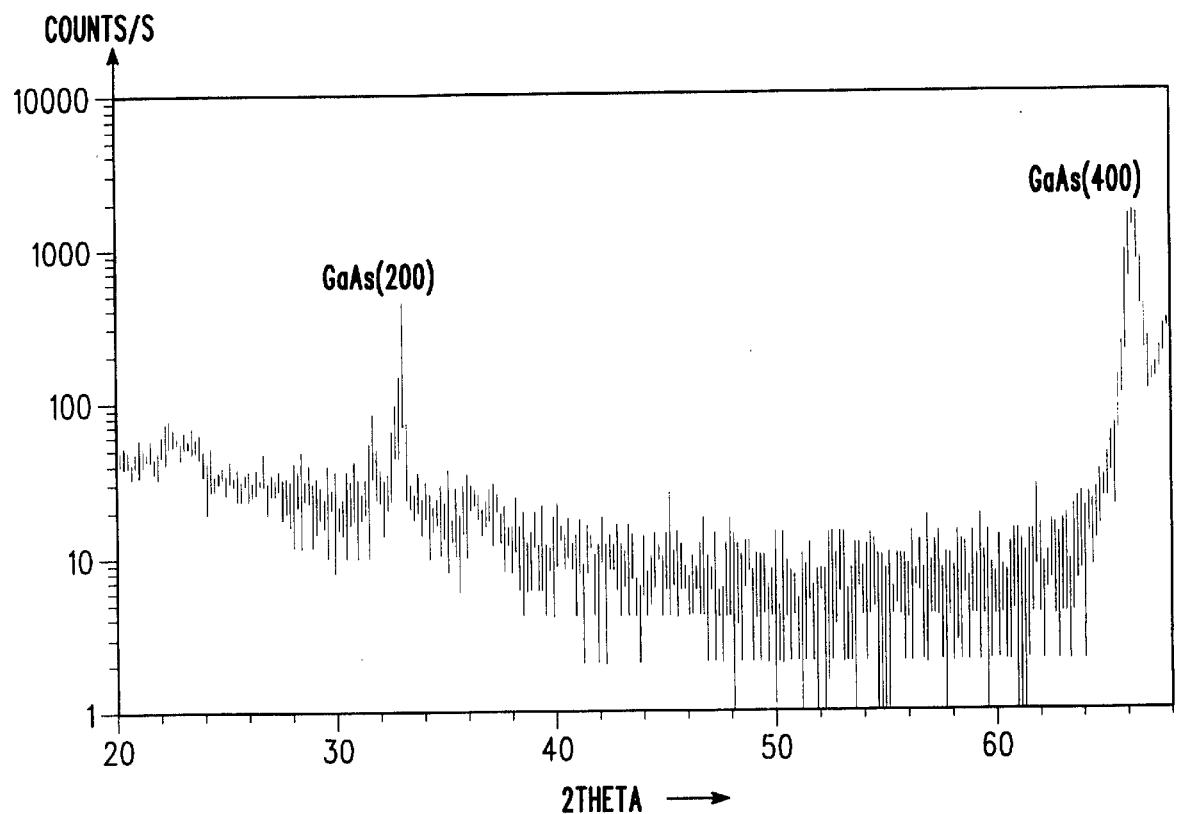
FIG. 8 illustrates an x-ray diffraction spectrum of a structure including an amorphous oxide layer.

FIG. 8 illustrates an x-ray diffraction spectrum taken on a structure including GaAs compound semiconductor layer 38 and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process forming a semiconductor structure including a silicon substrate, an overlying oxide layer, and a monocrystalline gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers can be deposited overlying the monocrystalline oxide accommodating buffer layer.

Each of the variations of compound semiconductor materials and monocrystalline oxide accommodating buffer layer uses an appropriate template for initiating the growth of the compound semiconductor layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a compound semiconductor material layer comprising indium gallium arsenide, indium aluminum arsenide, or indium phosphide.

Figure 9:
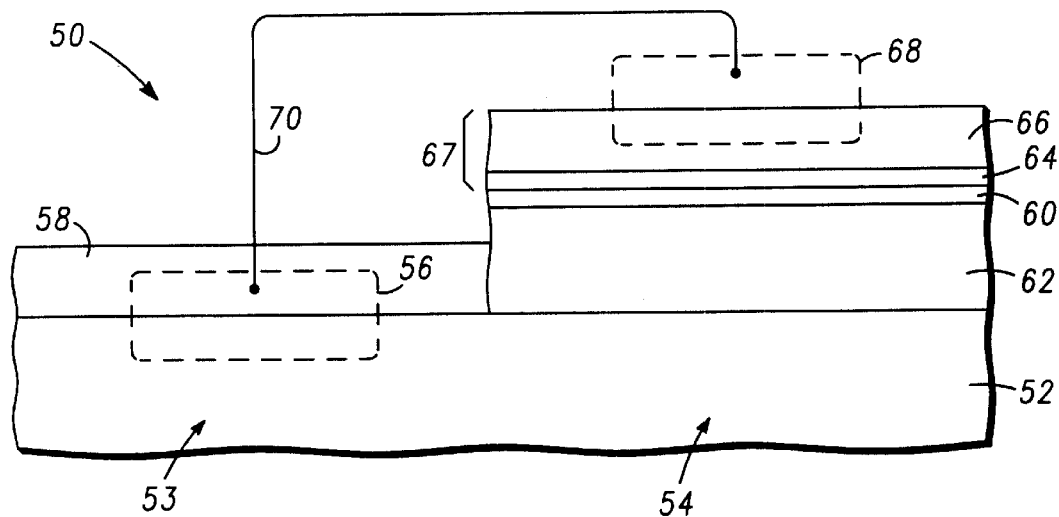
FIG. 9 illustrates schematically, in cross section, a device structure having a monocrystalline semiconductor substrate, a compound semiconductor layer, and semiconductor components in both the semiconductor and compound semiconductor layers.

FIG. 9 illustrates schematically, in cross section, a device structure 50 in accordance with a further embodiment of the invention. Device structure 50 includes a monocrystalline semiconductor substrate 52, preferably a monocrystalline silicon wafer. Monocrystalline semiconductor substrate 52 includes two regions, 53 and 54. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 58 such as a layer of silicon dioxide or the like may overlie electrical semiconductor component 56.

Insulating material 58 and any other layers that may have been formed or deposited during the processing of semiconductor component 56 in region 53 are removed from the surface of region 54 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 54 and is reacted with the oxidized surface to form a first template layer (not shown). In accordance with one embodiment of the invention a monocrystalline oxide layer 62 is formed overlying the template layer by a process of molecular beam epitaxy. Reactants including barium, titanium and oxygen are preferably deposited onto the template layer to form the monocrystalline oxide layer. Initially during the deposition the partial pressure of oxygen is preferably kept near the minimum necessary to fully react with the barium and titanium to form the monocrystalline barium titanate layer. The partial pressure of oxygen is then preferably increased to provide an overpressure of oxygen and to allow oxygen to diffuse through the growing monocrystalline oxide layer. The oxygen diffusing through the barium titanate preferably reacts with silicon at the surface of region 54 to form an amorphous layer of silicon oxide on the second region and at the interface between the silicon substrate and the monocrystalline oxide.

In accordance with an embodiment of the invention, the step of depositing the monocrystalline oxide layer is terminated by depositing a second template layer 60, which can be 1–10 monolayers of titanium, barium, strontium, barium and oxygen, titanium and oxygen, or strontium and oxygen. A layer 64 of a monocrystalline semiconductor material is then preferably deposited overlying the second template layer by a process of molecular beam epitaxy. The deposition of layer 64 may be initiated by depositing a layer of arsenic onto the template. This initial step is preferably followed by depositing gallium and arsenic to form monocrystalline gallium arsenide.

In accordance with one aspect of the present embodiment, after semiconductor layer 60 formation, the monocrystalline titanate layer and the silicon oxide layer, which is interposed between substrate 52 and the titanate layer, are exposed to an anneal process such that the titanate (preferably an alkaline earth metal titanate, preferably (Ba,Sr)TiO$_3$ and oxide layers form an amorphous oxide layer 62. An additional compound semiconductor layer 66 is then epitaxially grown over layer 64, using the techniques described above in connection with layer 64, to form compound semiconductor layer 67. Alternatively, the above described anneal process can be performed after formation of additional compound semiconductor layer 66.

In accordance with a further embodiment of the invention, a semiconductor component, generally indicated by a dashed line 68 is formed, at least partially, in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, an electromagnetic radiation (e.g., light—infra red to ultra violet radiation) emitting device, an electromagnetic radiation detector such as a photodetector, a heterojunction bipolar transistor (HBT), a high frequency MESFET, or another component that utilizes and takes advantage of the physical properties of compound semiconductor materials. In one preferred embodiment, semiconductor component 68 is a communications circuit configured to operate at a frequency greater than 2 GHz. Specifically, in a preferred embodiment, semiconductor component 68 includes a signal modulator, an oscillator, and a transceiver. The oscillator is preferably configured to operate at a frequency of 38 GHz. In addition, the transceiver is preferably configured to operate at a frequency of 76 to 77 GHz. In this preferred embodiment, the communications circuit is preferably a high electron mobility transistor (HEMT) structure. In another preferred embodiment, semiconductor component 68 comprises a transponder circuit preferably configured to operate at a frequency greater than 5 GHz. In this embodiment, semiconductor component 56 preferably comprises a CMOS digital control circuit preferably coupled via conductor 70 to the transponder circuit. The digital control circuit preferably has a memory, and the transponder circuit is preferably configured to receive information from an external chip (not shown) and to transfer that information to the memory.

Although illustrative structure 50 has been described as a structure formed on a silicon substrate 52 and having a barium (or strontium) titanate layer and a gallium arsenide layer 66, similar devices can be fabricated using other monocrystalline substrates, oxide layers and other monocrystalline compound semiconductor layers as described elsewhere in this disclosure. One preferred embodiment is for semiconductor component 68 to be InP. In the embodiment where semiconductor component 68 is InP, the oxide layer 62 is preferably an alkaline earth metal haffiate or an alkaline earth metal zirconate. In this embodiment, semiconductor component 68 is preferably a communications circuit, preferably a radar transceiver. Such a radar transceiver preferably operates at a frequency of 76–77 GHz.

Still referring to FIG. 9, a metallic conductor schematically indicated by the line 70 can be formed to electrically couple device 68 and device 56, thus implementing an integrated device that includes at least one component formed in the silicon substrate and one device formed in the monocrystalline compound semiconductor material layer. In a preferred embodiment, conductor 70 forms an interconnection coupling the CMOS digital circuit and the communications circuit described above.

Figure 10:
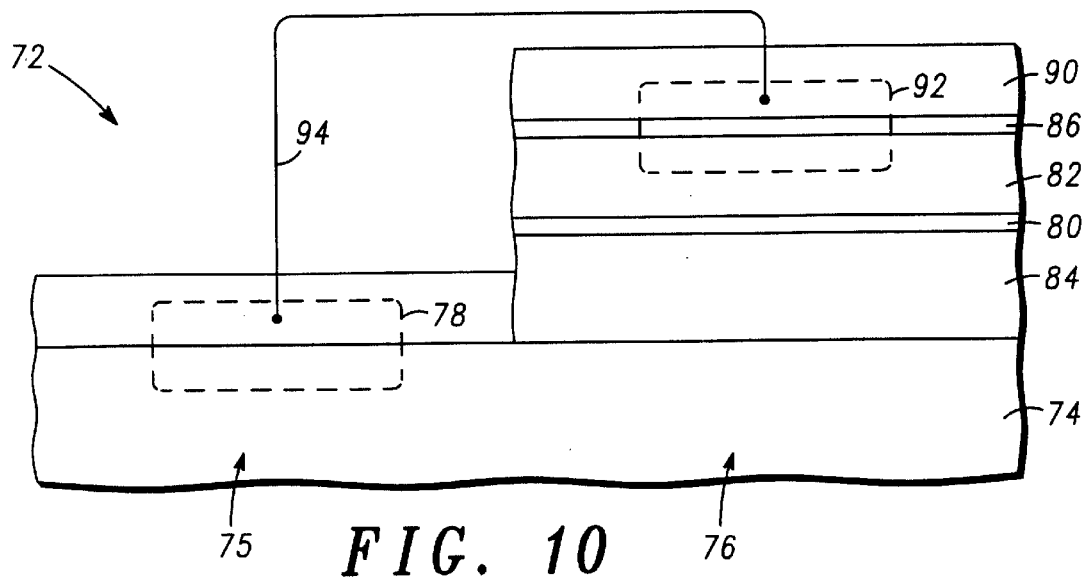
FIG. 10 illustrates schematically, in cross section, a device structure having a monocrystalline semiconductor substrate, a compound semiconductor layer, and semiconductor components in both the semiconductor and compound semiconductor layers.

FIG. 10 illustrates a semiconductor structure 72 in accordance with a further embodiment of the invention. Structure 72 includes a monocrystalline semiconductor substrate 74 such as a monocrystalline silicon wafer that includes a region 75 and a region 76. An electrical component schematically illustrated by the dashed line 78 is formed in region 75 using conventional silicon device processing techniques commonly used in the semiconductor industry. Using process steps similar to those described above, a monocrystalline oxide layer and an intermediate amorphous silicon oxide layer are formed overlying region 76 of substrate 74. A template layer 80 and subsequently a monocrystalline semiconductor layer 82 are formed overlying the monocrystalline oxide layer. An amorphous oxide layer 84 is then formed by exposing the monocrystalline oxide and silicon oxide films to an anneal process. In accordance with a further embodiment of the invention, an additional monocrystalline oxide layer 86 is formed overlying layer 82 by process steps similar to those used to form the monocrystalline oxide material described above, and an additional monocrystalline semiconductor layer 90 is formed overlying monocrystalline oxide layer 86 by process steps similar to those used to form layer 82. Monocrystalline oxide layer 86 may desirably be exposed to an additional anneal process to cause the material to become amorphous. However, in accordance with various aspects of this embodiment, layer 86 retains its monocrystalline form. In accordance with one embodiment of the invention, at least one of layers 82 and 90 are formed from a compound semiconductor material.

A semiconductor component generally indicated by a dashed line 92 is formed at least partially in monocrystalline semiconductor layer 82. In accordance with one embodiment of the invention, semiconductor component 92 may include a field effect transistor having a gate dielectric formed, in part, by monocrystalline oxide layer 86. In addition, monocrystalline semiconductor layer 90 can be used to implement the gate electrode of that field effect transistor. In accordance with one embodiment of the invention, monocrystalline semiconductor layer 82 is formed from a group III–V compound and semiconductor component 92 is a radio frequency amplifier that takes advantage of the high mobility characteristic of group III–V component materials. In accordance with yet a further embodiment of the invention, an electrical interconnection schematically illustrated by the line 94 electrically interconnects component 78 and component 92. Structure 72 thus integrates components that take advantage of the unique properties of the two monocrystalline semiconductor materials.

Figure 11:
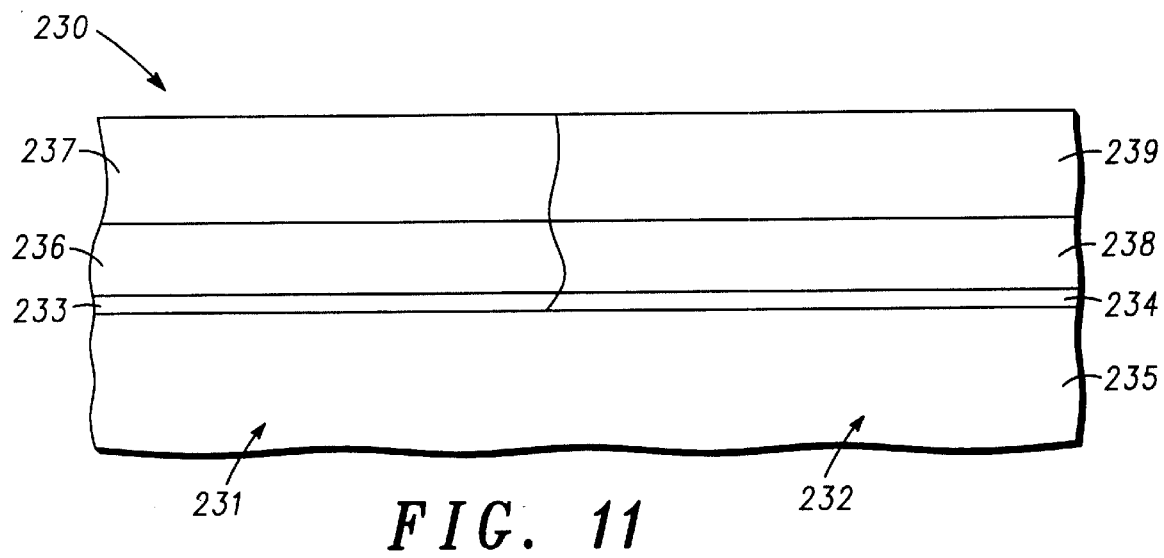
FIG. 11 illustrates schematically, in cross section, a device structure having a monocrystalline semiconductor substrate and two portions each with a different compound semiconductor material.

FIG. 11 illustrates schematically, in cross section, a device structure 230 in accordance with a further embodiment of the invention. Device structure 230 includes a monocrystalline semiconductor substrate 235, preferably a monocrystalline silicon wafer. Monocrystalline semiconductor substrate 235 includes two portions, 231 and 232. While portions 231 and 232 are shown adjacent and touching each other, they could be separated from each other by some distance. In other words, there could be a gap between compound semiconductor layers 237 and 239 and/or between oxide layers 236 and 238, all of which layers are described in more detail below. Structure 230 preferably includes two different oxide layers 236 and 238 located on substrate 235. These two oxide layers 236 and 238 are preferably monocrystalline as described above. One oxide layer 236 is located in portion 231, while the other oxide layer 238 is located in portion 232. Between oxide layer 236 and semiconductor substrate 235 is preferably an amorphous layer 233, which is preferably an amorphous oxide. Similarly, between oxide layer 238 and semiconductor substrate 235 is preferably an amorphous layer 234, which is also preferably an amorphous oxide. Amorphous layers 233 and 234 are preferably of the type described in more detail elsewhere herein, and preferably are silicon oxide. Oxide layers 236 and 238 are preferably formed by growing them epitaxially overlaying semiconductor substrate 235. This is preferably done by first growing the layers that are desired on one portion (either portion 231 or 232) on the entire semiconductor substrate 235. Next the portion that is desired to have these layers is preferably covered with a pattern of photoresist. Then, the layers that were applied before are etched off of the other portion of semiconductor substrate 23, and the pattern of photoresist is removed. Once this is done, the desired layers are preferably grown on the portion of semiconductor substrate 235 that has been etched. Oxide layer 236 is preferably an alkaline earth metal titanate, preferably (Ba,Sr)TiO$_3$. Oxide layer 238 is preferably either an alkaline-earth-metal zirconate or an alkali-earth-metal hafnate. Amorphous layers 233 and 234 are preferably formed while epitaxially growing oxide layers 236 and 238, preferably by increasing the partial pressure of oxygen above a level necessary for epitaxially growing oxide layers 236 or 238.

Still referring to FIG. 11, in a preferred embodiment, two different monocrystalline compound semiconductor layers 237 and 239 are formed on oxide layers 236 and 238 respectively, as shown. These two compound semiconductor layers 237 and 239 are preferably of the type described elsewhere herein. In one embodiment, compound semiconductor layer 237 is preferably an alkaline earth metal titanate, preferably (Ba,Sr)TiO$_3$. In other embodiments, compound semiconductor layer 237 is preferably GaAs, AlGaAs, ZnSe, or ZnSeS. Furthermore, compound semiconductor layer 239 is preferably either InP, AlInAs, AlGaInAsP, or InGaAs. Compound semiconductor layers 237 and 239 are preferably epitaxially grown in separate processes over oxide layers 236 and 238. Then structure 230 is preferably thermally annealed to convert oxide layers 236 and 238 from their monocrystalline structure to an amorphous structure. The process of thermal annealing preferably involves rapid thermal annealing, preferably between about 700° C. and 1000°C. The process of thermal annealing is preferably as described in more detail elsewhere herein.

Figure 12:
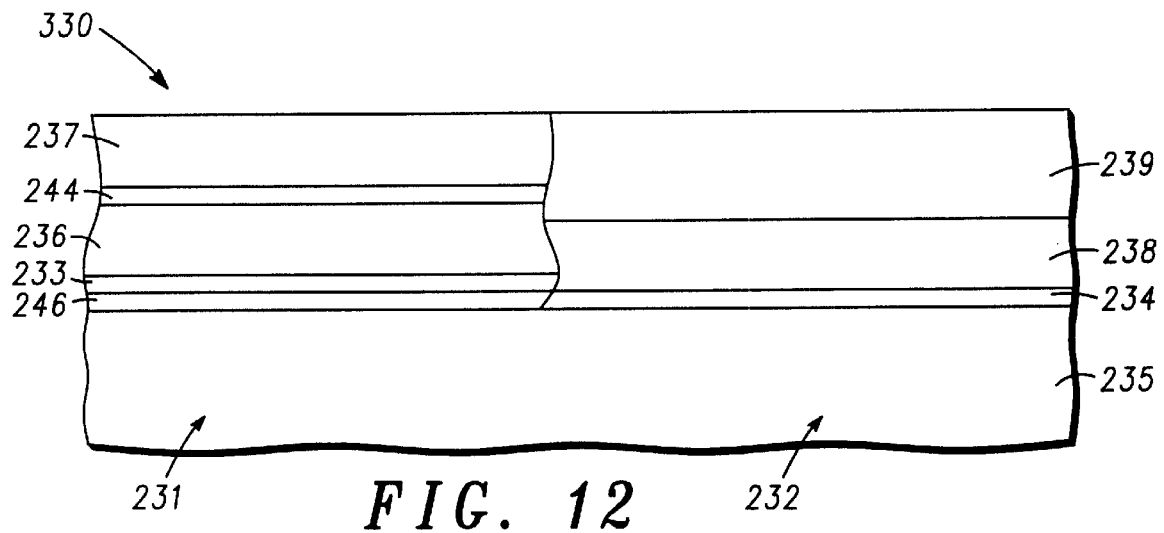
FIG. 12 illustrates schematically, in cross section, a device structure having a monocrystalline semiconductor substrate and two portions each with a different compound semiconductor material, and also having one or more template layers.

FIG. 12 illustrates schematically, in cross section, device structure 330 in accordance with another preferred embodiment of the invention. Template layer 246 is preferably formed on portion 231 of monocrystalline semiconductor substrate 235. Template layer 246 is preferably of the type template layer described elsewhere herein. Device structure 330 is similar to device structure 230 except that device structure 330 includes template layer 246 is preferably formed by depositing alkaline earth metals or alkaline earth metal oxides onto a silicon oxide layer on semiconductor substrate 235. The alkaline earth metal is preferably barium, strontium, or a mixture of the two, and the alkaline earth metal oxides are preferably barium oxide, strontium oxide, or barium strontium oxide. Substrate 235 is then heated to cause the alkaline earth metals or alkaline earth metal oxides to react with the silicon oxide layer. Specifically, template layer 246 is preferably made up of one to ten monolayers of Zn—O, Sr—S, Ti—As, Sr—O—As, Sr—Ga—O, or Sr—Al—O. Although FIG. 12 shows a template layer 246 on portion 231, as can easily be visualized by a person of ordinary skill in the art, a template layer may be provided on portion 232 instead of, or in addition to, template layer 246 on portion 231. The template layer (not shown) on portion 232 is preferably made up of one to ten monolayers of M—N or M—O—N wherein M is preferably Zr, Hf, Sr, or Ba, and N is preferably As, P, Ga, Al, or In. In addition, while template layer 246 is shown below amorphous layer 233, template layer 246 could be above amorphous layer 233, or template layer 246 could even be disbursed through amorphous layer 233. even be disbursed through amorphous layer 233.

Still referring to FIG. 12, in one embodiment, a second template layer 244 is also formed overlaying oxide layer 236. Template layer 244 is preferably formed by capping oxide layer 236 with a monolayer of titanium, titanium and oxygen, strontium, barium, barium and oxygen, or strontium and oxygen. Compound semiconductor layer 237 is preferably then formed by depositing a Group III material and a Group V material to form a III–V compound semiconductor material overlaying template layer 244. Compound semiconductor 237 is preferably GaAs, AlGaAs, ZnSe, or ZnSSe. Although FIG. 12 shows a template layer 244 on portion 236, as can easily be visualized by a person of ordinary skill in the art, a template layer may be provided on portion 238 instead of, or in addition to, template layer 244 on portion 236. The template layer (not shown) on portion 238 is preferably made up of one to ten monolayers of M—N or M—O—N wherein M is preferably Zr, Hf, Sr, or Ba, and N is preferably As, P, Ga, Al, or In.

Figure 13:
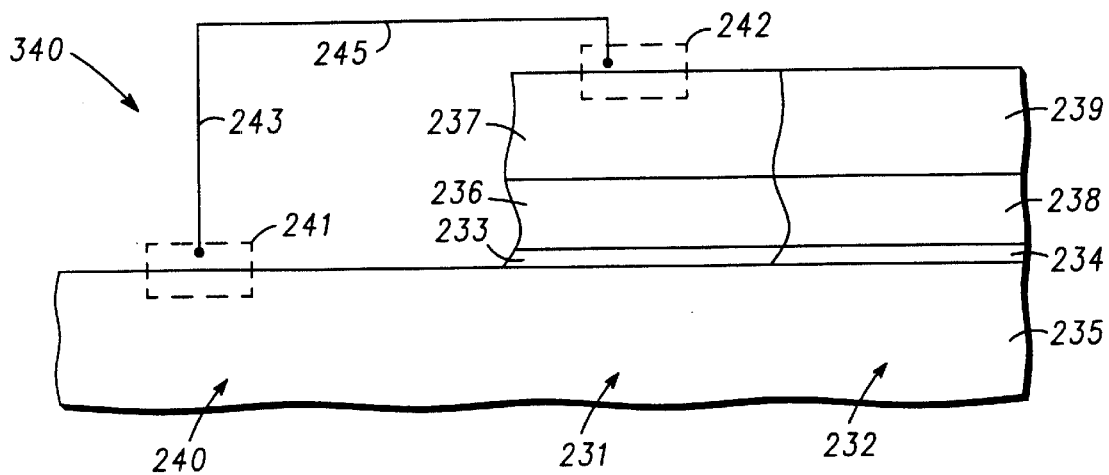
FIG. 13 illustrates schematically, in cross section, a device structure having a monocrystalline semiconductor substrate and two portions each with a different compound semiconductor material, and semiconductor components in both the semiconductor and the first portion of the compound semiconductor layers.

FIG. 13 illustrates schematically, in cross section, a device structure 340 in accordance with a further preferred embodiment of the invention. Monocrystalline semiconductor substrate 235 includes not only portions, 231 and 232, described above, but also a portion 240 as shown. Within device structure 340, a digital metal oxide semiconductor (MOS) circuit 245 is preferably formed, preferably at least partially, in semiconductor substrate 235 within portion 240. Another part of circuit 245 is preferably formed, preferably at least partially, in compound semiconductor layer 237 in portion 231. Silicon part 241 and compound semiconductor part 242 are preferably electrically coupled together with metal interconnection 243 (interconnect metallization) as shown. Compound semiconductor part 242 of circuit 245 is preferably capable of operation at normal frequencies greater than about 2 GHz, preferably between about 2 GHz and about 38 GHz. Thus, a single chip (device structure 340) is formed with different portions 231 and 240 suitable for performing different functions, one of which includes high frequency operation.

Figure 14:
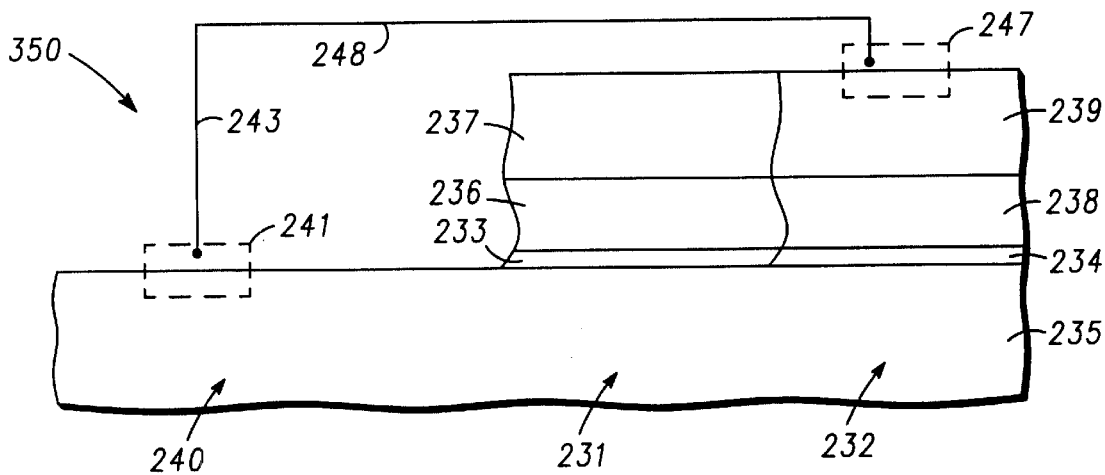
FIG. 14 illustrates schematically, in cross section, a device structure having a monocrystalline semiconductor substrate and two portions each with a different compound semiconductor material, and semiconductor components in both the semiconductor and the second portion of the compound semiconductor layers.

FIG. 14 illustrates schematically, in cross section, device structure 350 in accordance with a further preferred embodiment of the invention. Monocrystalline semiconductor substrate 235 includes portion 240 as described above for FIG.

13. Within device structure 350, a digital MOS (metal oxide semiconductor) circuit 248 is preferably formed, preferably at least partially (silicon part 241), in semiconductor substrate 235 within portion 240. Another part of circuit 248 is preferably formed, preferably at least partially (compound semiconductor part 247), in compound semiconductor layer 239 in portion 232. Silicon part 241, and compound semiconductor part 247 are preferably coupled together with interconnection 243 as shown. In the preferred embodiment, circuit 248 forms such a radar transceiver circuit preferably functioning and used as described below. Compound semiconductor part 247 of circuit 248 is preferably capable of operation at normal frequencies greater than about 70 GHz, preferably high enough frequency to form a radar transceiver circuit. Thus, a single chip (device structure 350) is formed with different portions 232 and 240 suitable for performing different functions, one of which includes high frequency operation as a transceiver circuit.

Figure 15:
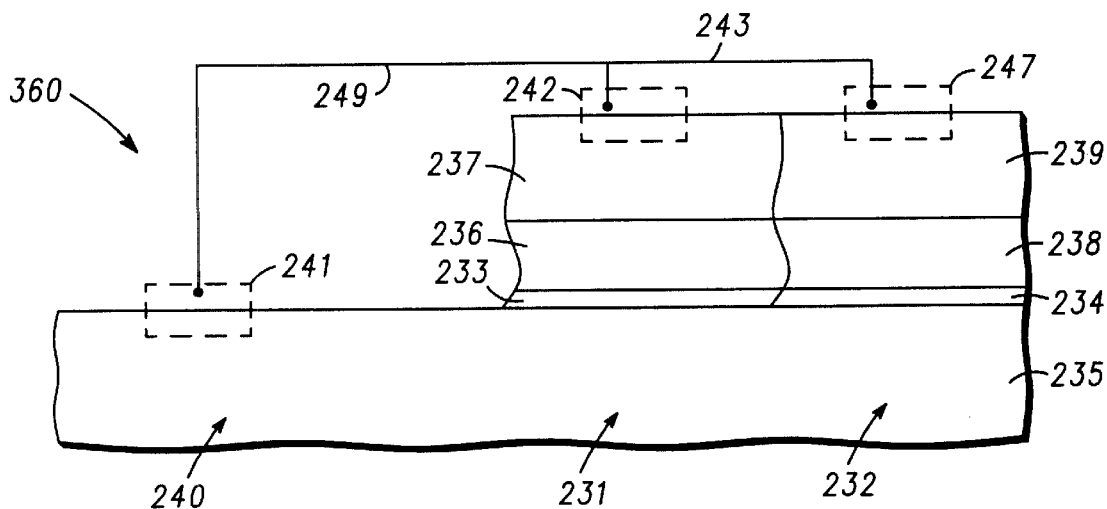
FIG. 15 illustrates schematically, in cross section, a device structure having a monocrystalline semiconductor substrate and two portions each with a different compound semiconductor material, and semiconductor components in the semiconductor layer, and in both the first portion and the second portion of the compound semiconductor layers.

FIG. 15 illustrates schematically, in cross section, device structure 360 in accordance with a further preferred embodiment of the invention. Within device structure 360, a digital MOS circuit 249 is preferably formed, preferably at least partially, in semiconductor substrate 235 within portion 240. A second part of circuit 249 is preferably formed, preferably at least partially, in compound semiconductor layer 237 in portion 231. Compound semiconductor part 242 is preferably an oscillator circuit, and preferably operates at a frequency between about 2 GHz and about 38 GHz. A third part of circuit 249 is preferably formed, preferably at least partially (compound semiconductor part 247), in compound semiconductor layer 239 in portion 232. Compound semiconductor part 247 is preferably a transceiver circuit, and preferably operates at a frequency greater than about 70 GHz. Silicon part 241, compound semiconductor part 242 (the oscillator circuit), and compound semiconductor part 247 (the transceiver circuit) are preferably coupled together with interconnection 243 as shown. Thus, a single chip (device structure 360) is formed with different portions 231, 232, and 240 each suitable for performing different functions. This single chip (device structure 320) has many applications, one of which includes operation as a radar device having uses including those described below.

Figure 16:
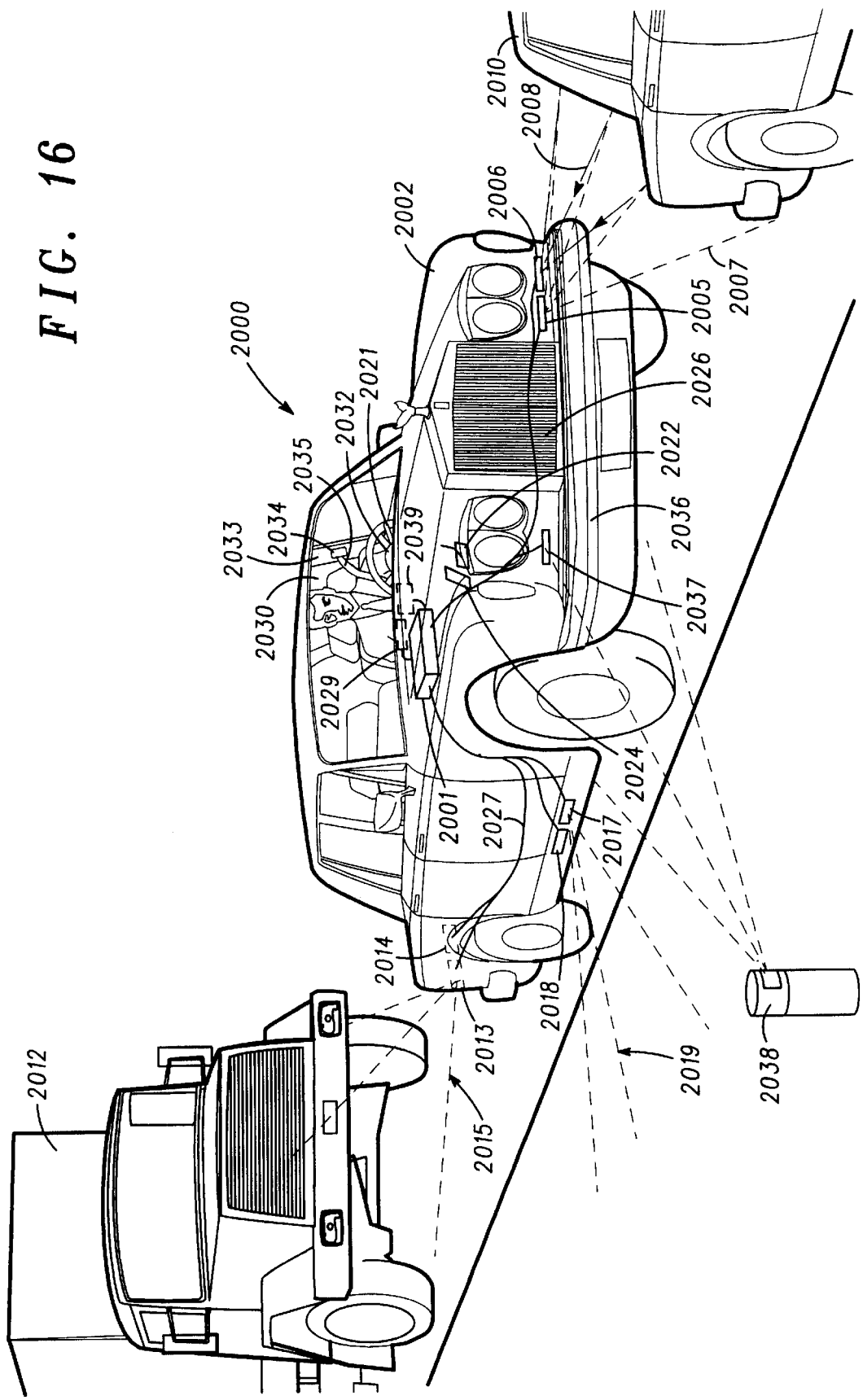
FIG. 16 is an isometric view illustrating a preferred application of the of the present invention showing an automobile equipped with a combined collision avoidance system, smart cruise control systems, crash protection system and automotive navigation system.

FIG. 16 is an isometric view illustrating a preferred application of the of the present invention showing an automobile 2002 equipped with a combined collision avoidance system, smart cruise control systems, crash protection system and automotive navigation system (collectively intelligent transportation system 2000). Although in the preferred embodiment these systems are combined, a person of ordinary skill in the art can see that these systems could be provided individually or in any combination. Although automobile 2002 is depicted in FIG. 16 as a car, automobile 2002 could also be a truck, van, sport utility vehicle, motor cycle, motor home, bus, tractor trailer, farm vehicle, construction equipment, train, trolley, boat, ship, barge, submarine, hovercraft, aircraft, helicopter, spacecraft, or other vehicle used for the transportation of people, freight, or other items.

Intelligent transportation system 2000 contains at its heart controller 2001 which preferably contains one or more semiconductors made of the monocrystalline compound semiconductor material for use with microwave and radiofrequency (RF) signals described herein. Controller 2001 is connected to several peripheral devices preferably via cables 2027. While controller 2001 is shown physically located at one central location, the functions performed by controller 2001 could be performed at different locations including at radar transmitter 2005, radar receiver 2006, etc. One such peripheral device shown in FIG. 16 is forward radar transmitter 2005 which transmits electromagnetic signal 2007 in front of automobile 2002. If there is an object in front 2010 of automobile 2002, then part of signal 2007 is reflected off of object in front 2010 forming reflected signal 2008. In FIG. 16, the object in front 2010 of automobile 2002 is another automobile, which would be common when operating automobile 2002 in traffic. However, object in front 2010 could be other items that might be in front of a car including pedestrians, bicycles, trees, boulders, livestock, buildings, bridge abutments, jersey barriers, trains, etc. Part of reflected signal 2008 reaches forward radar receiver 2006, which transmits the signal received back to controller 2001. While radar transmitter 2005 and radar receiver 2006 are shown as being two separate devices, they could actually be one device that performs both functions. Radar transmitter 2005 and radar receiver 2006 preferably contain one or more semiconductors made of the monocrystalline compound semiconductor material for use with microwave and radiofrequency (RF) signals described herein. From the frequency (Doppler shift), phase shift, timing, etc. of reflected signal 2008, in ways described herein and well known to a person of ordinary skill in the art of radar, controller 2001 preferably determines the distance and relative speed of object in front 2010, and takes appropriate action as necessary.

Such action might include warning the driver 2030 of automobile 2002 via audio transducer 2029. Audio transducer 2029 might be a warning buzzer, a speaker which broadcasts a prerecorded or synthesized warning message, etc. Other action that controller 2001 might take includes adjusting the throttle 2024 of engine 2026 of automobile 2002. This is a smart cruise control type action. The controller 2001 may adjust the throttle 2024 directly, or by sending an appropriate signal to a separate cruise control 2021 to adjust throttle 2024. If controller 2001 determines that object in front 2010 (another automobile) is further in front of automobile 2002 than necessary, and automobile 2002 is traveling slower than the setting of cruise control 2021, then controller 2001 may tell cruise control 2021 to speed up. On the other hand, if controller 2001 determines that object in front 2010 (another automobile) is a little bit too close to automobile 2002 for safety considerations, then controller 2001 may tell cruise control 2021 to slow down. A similar message to slow down might be sent even if object in front 2010 (another automobile) is far enough away if controller 2001 determined that object in front 2010 (another automobile) was slowing down. In addition, if controller 2001 determines that object in front 2010 (another automobile) is considerably too close to automobile 2002 for safety considerations, or the relative speed of object in front 2010 is substantially below that of automobile 2002, then controller 2001 may actuate the brake system 2022. This is a collision avoidance type action. Controller 2001 would preferably actuate the brake system 2022 in proportion to the need at the rate of deceleration necessary and prudent under the circumstances.

In the extreme case, where controller 2001 determines that based on the location and relative speed of the object in front 2010 of automobile 2002 that a collision is imminent, controller 2001 may take action to prepare for a collision. Such action would be that of a crash protection system. Such action might include actuating seat belt mechanism 2034 to lock, or preferably tighten, seat belt 2035. similarly, controller 2001 might actuate a mechanism that would extend bumper 2036 forward to provide more distance for absorbing the energy of collision similarly to how a person might extend their arm to absorb the energy of collision when they are about to bump into something. In the most drastic case, controller 2001 might deploy front air bag 2032 to help protect driver 2030 from being injured in the imminent collision. Deploying front air bag 2032 is the most drastic action to take because it interferes with the driver's 2030 ability to control the automobile 2002, including potentially preventing driver 2030 from taking evasive action to avoid the imminent collision. In addition, air bag 2032 deployment also necessitates the expensive and time consuming repackaging of air bag 2032. Consequently, unnecessary deployments of front air bag 2032 would hardly be tolerable. However, early deployment would increase the amount of time available in which front air bag 2032 must deploy, thus reducing the required rate of deployment and reducing the risk of physical injury, especially to children, resulting from front air bag 2032 deployment.

Another such peripheral device shown in FIG. 16 preferably connected to controller 2001 by cables 2027 is backward radar transmitter 2013 which transmits an electromagnetic signal 2015 behind automobile 2002. If there is an object 2012 behind automobile 2002, then part of signal 2015 is reflected off of the object 2012 behind forming a reflected signal as described above for the forward radar. In FIG. 16, the object 2012 shown behind automobile 2002 is a truck, which would not be uncommon when operating automobile 2002 in traffic. However, the object 2012 behind automobile 2002 could be other items that might be behind a car including pedestrians (including small children that are too short to be visible to driver 2030), bicycles, trees, boulders, buildings, poles, mail boxes, parked cars, pets, etc. As described above, from the frequency (Doppler shift), phase shift, timing, etc. of the reflected signal, in ways described herein and well know to person of ordinary skill in the art of radar, controller 2001 preferably determines the distance and relative speed of the object 2012 behind automobile 2002, and takes appropriate action as necessary.

Backward radar transmitter 2013 and receiver 2014 are most useful when automobile 2002 is backing up. As would be apparent to a person of ordinary skill in the art, the backward radar transmitter 2013 and receiver 2014 (in conjunction with controller 2001 and the other peripherals) perform similar functions in similar ways when backing up that forward radar transmitter 2005 and receiver 2006 perform when going forward—mainly warning driver 2030 and applying the brakes 2022. These functions were described above. However, driver 2030 visibility is typically not as good when backing as when going forward. Therefore, backward radar transmitter 2013 and receiver 2014 also perform an important function of detecting objects 2012 behind the automobile 2002 that driver 2030 cannot see. Perhaps the most important such function is to detect small children which often wander behind a backing vehicle. Without this invention these small children are all too often tragically killed by their own relatives in their own driveways.

Other such peripheral devices shown in FIG. 16 preferably connected to controller 2001 by cables 2027 are side radar transmitter 2017 and side radar receiver 2018 which transmit electromagnetic signal to the side of automobile 2002 and receive reflections from objects (not shown) located there. Although for clarity FIG. 16 depicts side radar transmitter 2017 and side radar receiver 2018 on one side of automobile 2002 only, such side radar transmitter 2017 and side radar receiver 2018 would preferably be provided on both sides of automobile 2002, as would be apparent to a person of ordinary skill in the art. Side radar transmitter 2017 and side radar receiver 2018 preferably connect to controller 2001 and in conjunction therewith, perform functions similar to those described above for forward and backward radar. Specifically, side radar transmitter 2017 and side radar receiver 2018 are used to detect objects in the driver's 2030 blind spot, or that driver 2030 fails to take notice of. For instance, intelligent transportation system 2000 would preferably warn driver 2030 if he turned on the turn signal or started to move into an adjacent lane and side radar transmitter 2017 and side radar receiver 2018 detected another vehicle in the adjacent lane on that side. If side radar transmitter 2017 and side radar receiver 2018 (in conjunction with controller 2001) detected a large object (such as another vehicle) that was about to impact automobile 2002 on the side, then controller 2001 might actuate seat belt mechanism 2034 to lock, or preferably tighten, seat belt 2035; or if a large object was about to impact automobile 2002 at a high relative rate of speed, controller 2001 might deploy side air bag(s) 2033. In the case of side impacts, advance deployment of air bag 2033 would be a substantial advantage since little space exists between driver 2030 (or a passenger on the side of the impact) and the side of automobile 2002. As a result of the small amount of space (distance), there is little time to deploy a side air bag 2033 once the impact occurs.

In a more sophisticated and preferred embodiment of intelligent transportation system 2000, the front, side, and rear radar systems work together to keep track of the traffic around automobile 2002. Additional radar transmitters and receivers (not shown) could be used if necessary to provide a full 360 degree view (or nearly 360 degrees) or to help distinguish different objects. Such a more sophisticated system would allow additional collision avoidance actions such a swerving to one side to avoid colliding with an object in front 2010. Such a system would preferably also allow swerving to avoid a side impact from another vehicle. In such an embodiment, controller 2001 would be provided with the ability to actuate the steering of automobile 2002 (such ability not shown).

Still referring to FIG. 16, intelligent transportation system 2000 would preferably also perform automobile navigational functions. These functions include receiving information through receiver 2037 from various sources including from road side transmitters 2038. Global positioning system (GPS) data would also preferably be used (not shown). The information received would preferably include the location of automobile 2002, which controller 2001 would preferably display on a map shown on a screen 2039 located in automobile 2002 where driver 2030 can easily view it. Driver 2030 could preferably enter his. destination and receive instructions via audio transducer 2029, or screen 2039, regarding which route to take, when to turn, what lane to get in, etc. Intelligent transportation system 2000 would preferably select a route to recommend based on current traffic and road conditions information received from road side transmitters 2038.

Figure 17:
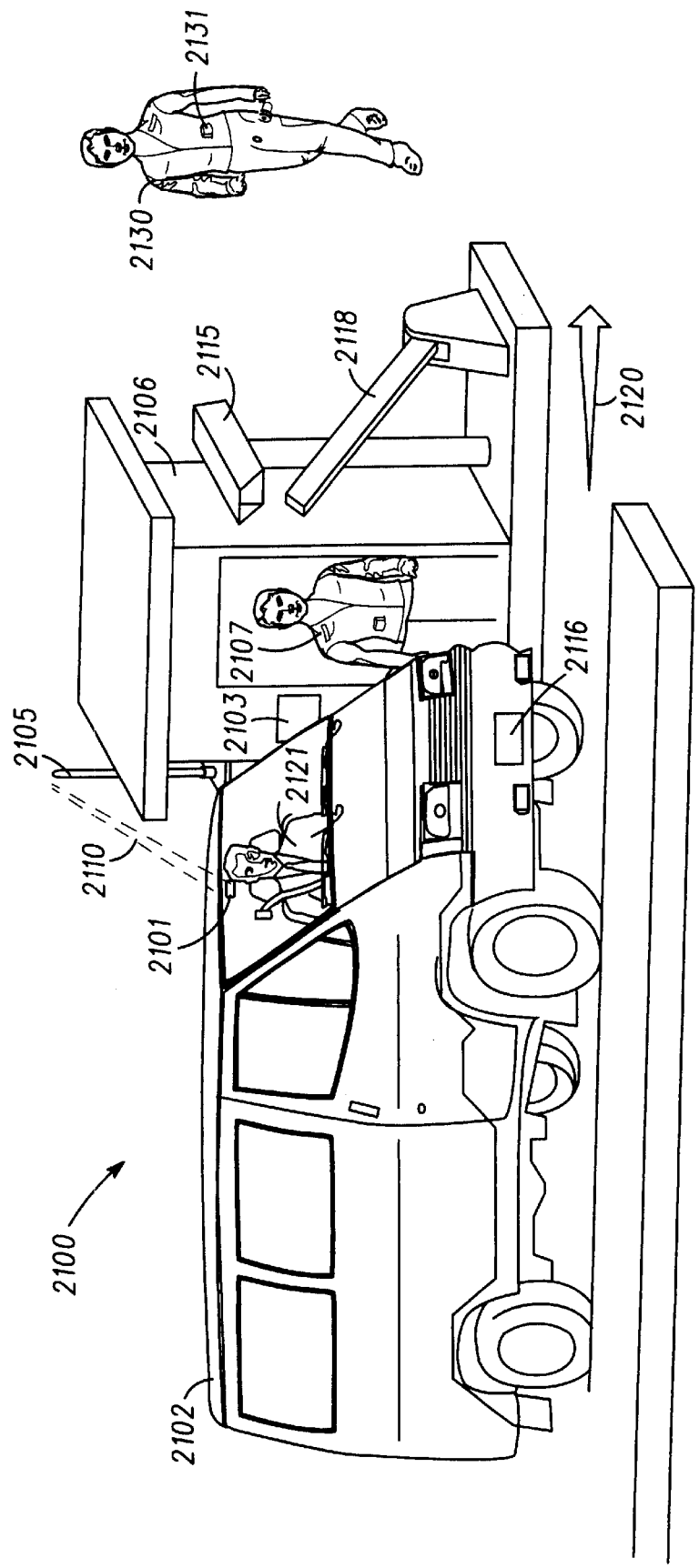
FIG. 17 is an isometric view illustrating a preferred application of the of the present invention showing an automobile driving through a toll lane equipped with an electronic toll collection system.

FIG. 17 is an isometric view illustrating a preferred application of the of the present invention showing an automobile 2102 driving through a toll lane 2120 equipped with an electronic toll collection system 2100. Although automobile 2102 is depicted in FIG. 17 as a minivan, automobile 2002 could also be a car, truck, van, sport utility vehicle, motor cycle, motor home, bus, tractor trailer, farm vehicle, construction equipment, train, trolley, boat, ship, barge, submarine, hovercraft, aircraft, helicopter, spacecraft, or other vehicle used for the transportation of people, freight, or other items.

The preferred embodiment of electronic toll collection system 2100 preferably includes an interrogator (reader) 2103 located in the toll booth, and a transponder (tag) 2101 installed on the dashboard, windshield or other location on the automobile 2102. Reader 2103 is preferably connected to a radio frequency (RF) antenna 2105 which broadcasts and receives RF signals to and from tag 2101. Reader 2103 preferably sends a signal that triggers tag 2101, requests specific information, and provides an acknowledgement message to the tag 2101. The tag 2101 preferably identifies the automobile 2102 (via an identification code), providing sufficient information to bill, debit, or charge the owner or other appropriate entity (typically driver 2121) for the amount of the toll. Tag 2101 may contain only read-only information, or may (smart tag) hold information as to the balance in the user's (typically driver's 2121) account. In the preferred embodiment, this communication can all take place while automobile 2102 drives through toll booth 2120 without stopping.

Electronic toll collection system 2100 preferably has some kind of enforcement means for deterring passage through the toll booth 2120 by drivers 2121 of automobiles 2102 that do not have tags 2101 or are delinquent in their payment of tolls. Such enforcement means may include a gate 2118 that opens only when valid account information has been provided, or driver 2121 has paid attendant 2107 the required toll. However, a gate 2118 generally requires that automobile 2102 stop and wait for gate 2118 to open. A means of enforcement that does not require automobile 2102 to stop, and is therefore preferred, is the use of a surveillance camera 2115 that photographs automobiles 2102 and preferably drivers 2121 that do not have tags 2101. From the photographs taken by camera 2115, the automobile 2102 license number can be obtained from license plate 2116 to collect evidence for bill collection from driver 2121 or, if appropriate, for criminal enforcement. The license plate 2116 number of automobile 2102 can either be read manually, or preferably, through character recognition software. To provide the proper incentive, the fee for passage through toll booth 2120 without paying through electronic toll collection system 2100 should be enough greater than the fee charged when paying through electronic toll collection system 2100 to cover the additional cost of sending a bill based on the photograph obtained with camera 2115. Preferably character recognition software identifies a non-paying automobile 2102 quickly and automatically notifies the authorities soon enough to perform a traffic stop if the automobile 2102 or owner (presumably driver 2121) has repeatedly not paid tolls or is otherwise wanted by the law.

Electronic toll collection system 2100 eliminates the need for drivers 2121 to stop at toll booths, and eliminates the need for them to carry cash or other means of paying tolls. These consequences have various direct and indirect benefits including reducing commute times, reducing the need for as many attendants 2107 to serve in toll booths, reducing fuel consumption and air pollution caused by automobiles 2102 stopping and waiting in line at toll booths, and reducing crime resulting from the temptation to criminals of drivers 2121 who carry cash to pay tolls.

Electronic toll payment system 2100 can preferably also be used by pedestrian 2130 with tag 2131 to pay tolls for riding mass transit systems such as trains, or for purchasing various commodities such as gasoline, or for other purposes such as paying to see a movie in a theater. To operate the system, pedestrian 2130 simply presents tag 2131 near antenna 2105. Tags 2131 for such electronic toll payment systems 2100 may be read-only, or may contain information such as regarding account balance (smart cards).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A monolithically integrated communications circuit structure comprising:

a monocrystalline silicon substrate;

a first monocrystalline oxide layer comprising a first material formed overlying a first portion of the substrate;

a first amorphous layer underlying the first monocrystalline oxide layer;

a first layer of monocrystalline compound semiconductor material of first type formed overlying the first oxide layer;

a second monocrystalline oxide layer comprising a second material different than the first material formed overlying a second portion of the substrate;

a second amorphous layer underlying the second monocrystalline oxide layer; and a second layer of monocrystalline compound semiconductor material of second type different than the first type formed overlying the second oxide layer.

2. The structure of claim 1 wherein the first material comprises an alkaline earth metal titanate.

3. The structure of claim 2 wherein the first material comprises $(Sr,Ba)TiO_3$.

4. The structure of claim 2 wherein the first layer of monocrystalline compound semiconductor material comprises a material selected from the group consisting of GaAs, AlGaAs, ZnSe, and ZnSeS.

5. The structure of claim 4 further comprising a digital MOS circuit formed at least partially in the silicon substrate and a circuit capable of operation at a nominal frequency greater than about 2 GHz formed at least partially in the first layer of monocrystalline compound semiconductor material.

6. The structure of claim 2 further comprising a first template layer formed on the first portion.

7. The structure of claim 6 wherein the first template layer comprises 1–10 monolayers of material selected from the group consisting of Zn—O, Sr—S, Ti—As, Sr—O—As, Sr—Ga—O, and Sr—Al—O.

8. The structure of claim 1 wherein the second material comprises an oxide selected from the group consisting of alkaline earth metal zirconates and alkaline earth metal hafnates.

9. The structure of claim 8 wherein the second layer of monocrystalline compound semiconductor material comprises a material selected from the group consisting of InP, AlInAs, AlGaInAsP, and InGaAs.

10. The structure of claim 9 further comprising a digital MOS circuit formed at least partially in the silicon substrate and a second circuit capable of operation at a nominal frequency greater than about 70 GHz formed at least partially in the second layer of monocrystalline compound semiconductor material.

11. The structure of claim 10 wherein the second circuit comprises a radar transceiver circuit.

12. The structure of claim 9 further comprising a second template layer formed on the second portion.

13. The structure of claim 12 wherein the second template layer comprises 1–10 monolayers of material having a composition M—N or M—O—N wherein M is selected from the group consisting of Zr, Hf, Sr, and Ba and N is selected from the group consisting of As, P, Ga, Al, and In.

14. The structure of claim 1 further comprising:
   a digital circuit formed in at least partially in the silicon substrate;
   an oscillator circuit formed at least partially in the first layer of monocrystalline compound semiconductor material;
   a transceiver circuit formed at least partially in the second layer of monocrystalline compound semiconductor material; and
   an interconnection coupling together the digital circuit, the oscillator circuit, and the transceiver circuit.

15. A monolithically integrated communications circuit structure comprising:
   a monocrystalline silicon substrate;
   a first amorphous oxide layer comprising a first material formed overlying a first portion of the substrate;
   a first layer of monocrystalline compound semiconductor material of first type formed overlying the first amorphous oxide layer;
   a second amorphous oxide layer comprising a second material different than the first material formed overlying a second portion of the substrate; and
   a second layer of monocrystalline compound semiconductor material of second type different than the first type formed overlying the second amorphous oxide layer.

16. A monolithically integrated circuit comprising:
   a monocrystalline silicon substrate;
   a monocrystalline oxide layer epitaxially grown overlying the silicon substrate;
   an amorphous layer underlying the monocrystalline oxide layer;
   a monocrystalline compound semiconductor layer epitaxially grown overlying the monocrystalline oxide layer;
   a CMOS digital circuit formed at least partially in the silicon substrate; and
   a communication circuit configured to operate at a frequency greater than 2 GHz formed at least partially in the compound semiconductor layer.

17. The circuit of claim 16 wherein the monocrystalline compound semiconductor layer comprises GaAs.

18. The circuit of claim 17 wherein the communications circuit comprises a signal modulator, an oscillator, and a transceiver.

19. The circuit of claim 18 wherein the oscillator is configured to operate at a frequency of 38 GHz.

20. The circuit of claim 18 wherein the transceiver is configured to operate at a frequency of 76–77 GHz.

21. The circuit of claim 17 wherein the communications circuit comprises a HEMT structure.

22. The circuit of claim 17 wherein the oxide layer comprises an alkali earth metal titanate.

23. The circuit of claim 22 wherein the oxide layer comprises $(Ba,Sr)TiO_3$.

24. The circuit of claim 16 wherein the monocrystalline compound semiconductor layer comprises InP.

25. The circuit of claim 24 wherein the oxide layer comprises a material selected from the group consisting of alkali earth metal hafnates and alkali earth metal zirconates.

26. The circuit of claim 24 wherein the communications circuit comprises a radar transceiver.

27. The circuit of claim 26 wherein the radar transceiver is configured to operate at a frequency of 76–77 GHz.

28. The circuit of claim 16 further comprising an interconnection coupling the CMOS digital circuit and the communications circuit.

29. A monolithically integrated circuit comprising:
   a monocrystalline silicon substrate;
   a monocrystalline oxide layer epitaxially grown overlying the silicon substrate;
   an amorphous silicon oxide layer underlying the monocrystalline oxide layer;
   a monocrystalline compound semiconductor layer comprising GaAs epitaxially grown overlying the monocrystalline oxide layer;
   a transponder circuit configured to operate at a frequency greater than 5 GHz formed at least partially in the monocrystalline compound semiconductor layer; and
   a CMOS digital control circuit formed at least partially in the silicon substrate and coupled to the transponder circuit.

30. The circuit of claim 29 wherein the digital control circuit comprises a memory and the transponder circuit is configured to receive information from an external chip and to transfer that information to the memory.

31. The circuit of claim 29 wherein the monocrystalline oxide layer comprises an alkaline earth metal titanate.

32. A monolithically integrated communications circuit structure comprising:
   a monocrystalline silicon substrate;
   a first oxide layer comprising a first material of $(Sr,Ba)TiO_3$ formed overlying a first portion of the substrate;
   a first layer of monocrystalline compound semiconductor material of first type formed overlying the first oxide layer;
   a second oxide layer comprising a second material different than the first material formed overlying a second portion of the substrate; and
   a second layer of monocrystalline compound semiconductor material of second type different than the first type formed overlying the second oxide layer.

33. A monolithically integrated communications circuit structure comprising:
   a monocrystalline silicon substrate;
   a first oxide layer comprising a first material formed overlying a first portion of the substrate;
   a first template layer formed on the first portion;
   a first layer of monocrystalline compound semiconductor material of first type formed overlying the first oxide layer;

a second oxide layer comprising a second material different than the first material formed overlying a second portion of the substrate; and a second layer of monocrystalline compound semiconductor material of second type different than the first type formed overlying the second oxide layer.

34. The structure of claim 33 wherein the first material comprises an alkaline earth metal titanate.

35. The structure of claim 33 wherein the first template layer comprises 1–10 monolayers of material selected from the group consisting of Zn—O, Sr—S, Ti—As, Sr—O—As, Sr—Ga—O, and Sr—Al—O.

36. The structure of claim 33 wherein the second material comprises an oxide selected from the group consisting of alkaline earth metal zirconates and alkaline earth metal hafnates.

37. The structure of claim 36 wherein the second layer of monocrystalline compound semiconductor material comprises a material selected from the group consisting of InP, AlInAs, AlGaInAsP, and InGaAs.

38. The structure of claim 37 further comprising a digital MOS circuit formed at least partially in the silicon substrate and a second circuit capable of operation at a nominal frequency greater than about 70 GHz formed at least partially in the second layer of monocrystalline compound semiconductor material.

39. The structure of claim 38 wherein the second circuit comprises a radar transceiver circuit.

40. The structure of claim 38 further comprising a second template layer formed on the second portion.

41. The structure of claim 40 wherein the second template layer comprises 1–10 monolayers of material having a composition M—N or M—O—N wherein M is selected from the group consisting of Zr, Hf, Sr, and Ba and N is selected from the group consisting of As, P, Ga, Al, and In.

42. The structure of claim 33 further comprising:

a digital circuit formed in at least partially in the silicon substrate;

an oscillator circuit formed at least partially in the first layer of monocrystalline compound semiconductor material;

a transceiver circuit formed at least partially in the second layer of monocrystalline compound semiconductor material; and an interconnection coupling together the digital circuit, the oscillator circuit, and the transceiver circuit.

43. The structure of claim 33 wherein the first oxide layer comprises a first monocrystalline oxide layer and the second oxide layer comprises a second monocrystalline oxide layer.

44. The structure of claim 43 further comprising a first amorphous layer underlying the first oxide layer and a second amorphous layer underlying the second oxide layer.

45. The structure of claim 33 wherein the first oxide layer comprises a first amorphous oxide layer and the second oxide layer comprises a second amorphous oxide layer.

46. A monolithically integrated circuit comprising:

a monocrystalline silicon substrate;

an oxide layer epitaxially grown overlying the silicon substrate;

a monocrystalline compound semiconductor layer epitaxially grown overlying the oxide layer;

a CMOS digital circuit formed at least partially in the silicon substrate;

a communication circuit configured to operate at a frequency greater than 2 GHz formed at least partially in the compound semiconductor layer; and the communications circuit comprising a signal modulator, an oscillator, and a transceiver, the oscillator being configured to operate at a frequency of 38 GHz.

47. The circuit of claim 46 wherein the monocrystalline compound semiconductor layer comprises GaAs.

48. The circuit of claim 46 wherein the transceiver is configured to operate at a frequency of 76–77 GHz.

49. A monolithically integrated circuit comprising:

a monocrystalline silicon substrate;

an oxide layer epitaxially grown overlying the silicon substrate;

a monocrystalline compound semiconductor layer epitaxially grown overlying the oxide layer;

a CMOS digital circuit formed at least partially in the silicon substrate;

a communication circuit configured to operate at a frequency greater than 2 GHz formed at least partially in the compound semiconductor layer; and the communications circuit comprising a signal modulator, an oscillator, and a transceiver, the transceiver being configured to operate at a frequency of 76–77 GHz.

50. The circuit of claim 49 wherein the monocrystalline compound semiconductor layer comprises GaAs.

51. The circuit of claim 49 wherein the oscillator is configured to operate at a frequency of 38 GHz.

52. A monolithically integrated circuit comprising:

a monocrystalline silicon substrate;

an oxide layer epitaxially grown overlying the silicon substrate;

a monocrystalline compound semiconductor layer epitaxially grown overlying the oxide layer;

a CMOS digital circuit formed at least partially in the silicon substrate;

a communication circuit configured to operate at a frequency greater than 2 GHz formed at least partially in the compound semiconductor layer; and the communications circuit comprising a HEMT structure.

53. The circuit of claim 52 wherein the monocrystalline compound semiconductor layer comprises GaAs.

54. A monolithically integrated circuit comprising:

a monocrystalline silicon substrate;

an oxide layer epitaxially grown overlying the silicon substrate;

a monocrystalline compound semiconductor layer of InP epitaxially grown overlying the oxide layer;

a CMOS digital circuit formed at least partially in the silicon substrate; and a communication circuit configured to operate at a frequency greater than 2 GHz formed at least partially in the compound semiconductor layer.

55. The circuit of claim 54 wherein the oxide layer comprises $(Ba,Sr)TiO_3$.

56. The circuit of claim 54 wherein the oxide layer comprises a material selected from the group consisting of alkaline earth metal hafnates and alkaline earth metal zirconates.

57. The circuit of claim 54 wherein the communications circuit comprises a radar transceiver.

58. The circuit of claim 57 wherein the radar transceiver is configured to operate at a frequency of 76–77 GHz.

59. The circuit of claim 54, further comprising an interconnection coupling the CMOS digital circuit and the communications circuit.

* * * * *